United States Patent [19]
Matsuno et al.

[11] Patent Number: 6,096,569
[45] Date of Patent: Aug. 1, 2000

[54] METHOD OF AND APPARATUS FOR MANUFACTURING THIN SOLAR BATTERY

[75] Inventors: Yoshinori Matsuno; Yoshitatsu Kawama; Hiroaki Morikawa; Satoshi Arimoto; Hisao Kumabe; Toshio Murotani, all of Hyogo, Japan

[73] Assignee: Mitsubishi Denki Kabushiki Kaisha, Tokyo, Japan

[21] Appl. No.: 09/201,660

[22] Filed: Dec. 1, 1998

Related U.S. Application Data

[62] Division of application No. 08/944,562, Oct. 6, 1997, abandoned, which is a continuation of application No. 08/544,395, Oct. 17, 1995, abandoned.

[30] Foreign Application Priority Data

Nov. 15, 1994 [JP] Japan .................................. 6-280546

[51] Int. Cl.[7] .................................................. H01L 31/18
[52] U.S. Cl. .................................. 438/19; 438/22; 438/48
[58] Field of Search ......................... 438/458, 19, 21, 438/22, 48

[56] References Cited

U.S. PATENT DOCUMENTS

| | | |
|---|---|---|
| 4,050,729 | 9/1977 | Hutson . |
| 4,486,232 | 12/1984 | Nakatani et al. ................. 75/252 |
| 4,543,441 | 9/1985 | Kumada et al. ................. 136/249 |
| 4,904,012 | 2/1990 | Nishiguchi . |
| 4,968,354 | 11/1990 | Nishiura et al. ................ 136/244 |
| 5,397,713 | 3/1995 | Hamamoto et al. ............. 438/97 |
| 5,549,340 | 8/1996 | Nagai et al. . |
| 5,665,607 | 9/1997 | Kawama et al. ................ 438/64 |

FOREIGN PATENT DOCUMENTS

| | | | |
|---|---|---|---|
| 62-142365 | 6/1987 | Japan ................ | 136/244 |
| 63-107073 | 5/1988 | Japan ................ | 136/244 |
| 3-38069 | 2/1991 | Japan ................ | 136/258 |
| 3-165578 | 7/1991 | Japan . | |

OTHER PUBLICATIONS

Seventeenth IEEE Photovoltaic Specialists Conference–1984, pp. 1294–1296, May 1984, R.M. Swanson "Point Contact Silicon Solar Cells".

*Primary Examiner*—Mary Wilczewski
*Assistant Examiner*—Yung A. Lin
*Attorney, Agent, or Firm*—Oblon, Spivak, McClelland, Maier & Neustadt, P.C.

[57] ABSTRACT

A process of forming electrodes is simplified during modularizing of a solar battery. According to the manufacturing method and the manufacturing apparatus, a thin solar battery is manufactured at a reduced cost and with a better yield. Using a robot which includes a suction chip which can handle a semiconductor film 2 without any damage which is separated from a particular substrate 1, the semiconductor films 2 are each accurately placed through a transparent resin 3 onto a glass substrate 7 which serves as a window of a solar battery, and p-type and n-type electrodes are printed at a time on the semiconductor films 2 which are arranged. Further, since a monolithic tab electrode is soldered to connect the electrodes, the manufacturing processes of the solar battery are simplified.

14 Claims, 34 Drawing Sheets

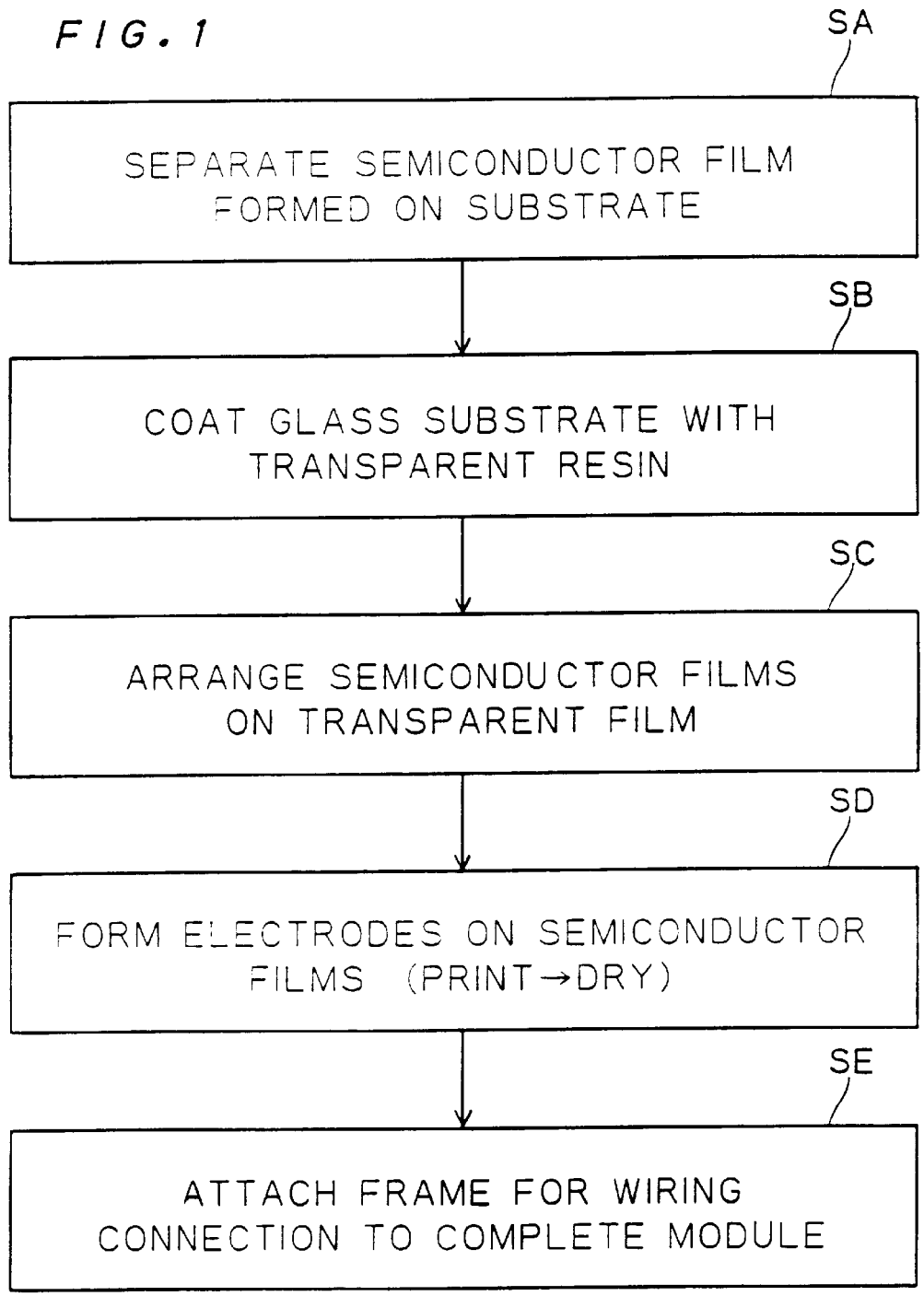

F I G . 39
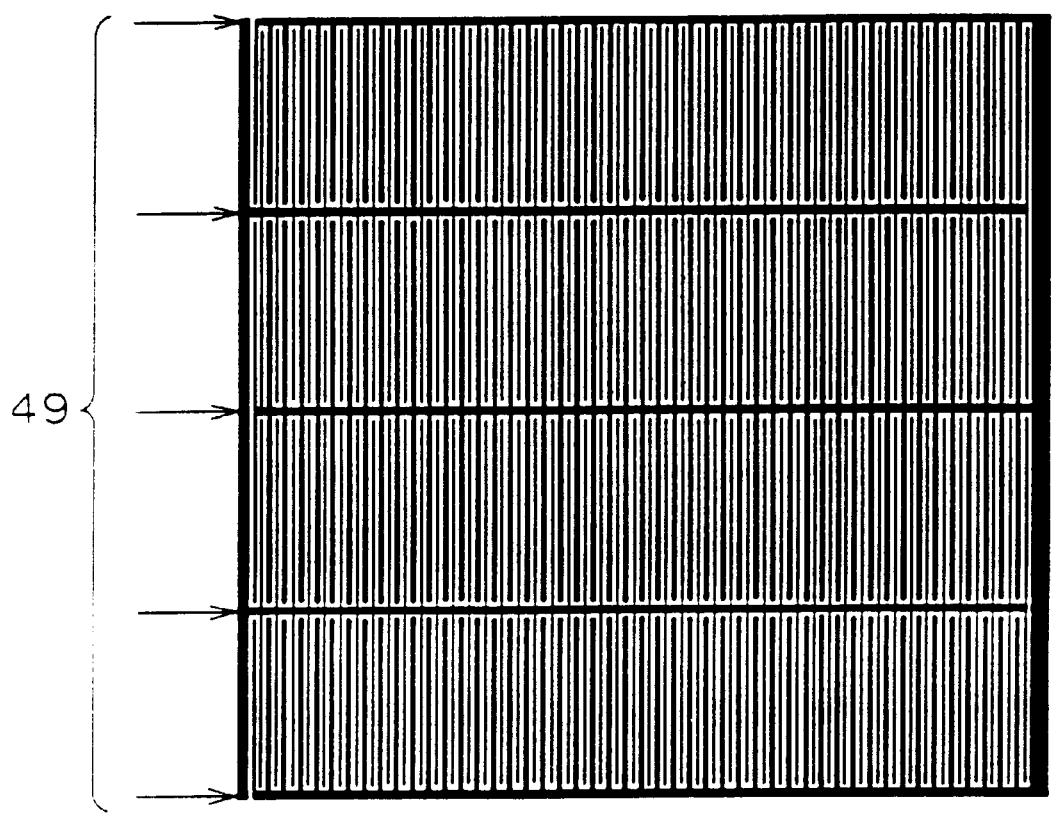

METHOD OF AND APPARATUS FOR MANUFACTURING THIN SOLAR BATTERY

This application is a Division of application Ser. No. 08/944,562 Filed on Oct. 6, 1997, now abandoned, which is a CONT of Ser. No. 08/544,395 filed Oct. 17, 1995, now abandoned.

BACKGROUND OF THE INVENTION

1. Field of the Invention

The present invention relates to a method of and an apparatus for manufacturing a thin solar battery, and in particular to a method of accurately and easily forming an electrode on one side of a power generation layer, that is, a semiconductor film, a method of treating the semiconductor film for this purpose and a thin solar battery manufacturing apparatus which treats a semiconductor film.

2. Description of the Background Art

Solar power generation systems for ordinary houses are marketed increasingly faster these days. Under the circumstances, it is a challenge for manufacturers to manufacture a solar battery cell and a solar battery module for use in solar power generation at a low cost without deteriorating photoelectric conversion efficiency of the battery. Considering the contents of a manufacturing cost of a solar battery module, it is understood that a silicon material from which the battery is basically manufactured and a cost for assembling the module are expensive. Hence, a cost reduction in these two items is generally regarded as the fastest way to realize a reduction in the total manufacturing cost.

Meanwhile, in a step for assembling a conventional solar battery cell as a module which is disclosed for example in "Solar Battery Handbook," Institute of Electrical Engineers, Solar Battery Committee, Chap. 6 Modularizing Technique, pgs. 163–167 (1985, First edition, First print), connection of cells using element link lines called "tab" is complex. This will be described in the following with reference to FIG. 50A which shows a step of modularizing a conventional solar battery (cell). In the step shown in FIG. 50A, tab electrodes 73 are formed on the both sides of each silicon substrate 74 (typically of a thickness equal to or more than 350 $\mu$m) which will serve as a power generation layer of the solar battery. Next, at the step shown in FIG. 50B, solar battery cells are arranged for serial connection to each other and the tab electrode 73 of each solar battery cell is soldered to the tab electrode 73 of an adjacent solar battery cell. Following this, at the step shown in FIG. 50C, a transparent sheet 8 such as EVA (ethylene vinyl acetate) is placed on a tetrafilm 75, i.e., a fluoride vinyl film in which an aluminum foil is sandwiched, and the silicon substrates 74 arranged and interconnected at the step shown in FIG. 50B are placed on the transparent sheet 8, and further another transparent sheet 8 is placed on the tetrafilm 75, and finally a glass 7, i.e., a modularizing structure member which serves also as a window member, is stacked on the upper transparent sheet 8. At the step shown in FIG. 50D, the stacked structure is heated to about 150° C. in a bonding apparatus for deaeration between the modularizing glass 7 and the tetrafilm 75. Further, at the step shown in FIG. 50E, the stacked structure is framed into a frame 76 made of aluminum, an output terminal 77 is attached to the stacked structure using a silicon resin and a back plate 78 is fit in the stacked structure, thereby completing modularizing.

Electrodes are formed on the both sides of the silicon substrate in the conventional solar battery as described above. Hence, connection between the cells requires connecting a tab which is formed on a back side of each cell with the cell surface of the adjacent cell which is arranged at a desired position. This step is very complicated. In addition, since the modularizing steps are as described above, the step of stacking the elements ranging from the tetrafilm to the modularizing glass and the subsequent deaeration step are complex, and therefore, a reduction in the assembling cost necessary for these steps is difficult. Further, since a silicon substrate is used as a basic body of a solar battery as described earlier, it is difficult to reduce a cost for a silicon material. Although it is said that a solar battery using a crystal silicon wafer needs be as thick as 500 $\mu$m in general, in reality, the thickness does not need to be 100 $\mu$m or larger for absorption of solar light. Rather, if incident light is to be contained within a power generation member, that is, light containment is to be efficient so that an optical length of light having a long wave length and a small absorption coefficient becomes sufficiently long, since carriers created by the incident light within the power generation member are efficiently collected when the thickness of the solar battery is thin, the solar battery is preferably thin so as to achieve excellent performance. In other words, a reduction in the thickness of a semiconductor portion which serves as the power generation layer is advantageous from two points of view, one being a reduction in the manufacturing cost (material cost) and the other being the photoconversion efficiency.

To this end, a thin solar battery has been proposed which has a cell structure in which a thin semiconductor film thinner than at least a silicon substrate is formed on the silicon substrate and separated from the silicon substrate and a desired electrode is formed on the semiconductor film. FIGS. 51A to 51E are views describing a conventional thin solar battery as that disclosed by Japanese Patent Laid-Open Gazette No. 4-333288 along with method of manufacturing the same. In FIGS. 51A to 51E, denoted at 101 is a heat-resistant substrate formed by a silicon wafer, denoted at 111 is an insulation layer which is formed by a silicon oxide film, denoted at 112 is a first silicon layer having a small resistance, denoted at 113 is a second silicon layer having a large resistance, denoted at 114 is a gap which is locally created in the insulating layer 111, denoted at 106 is a grid electrode, and denoted at 107 is a back surface electrode.

First, the insulation layer 111 is formed selectively on the heat-resistant substrate 101 (FIG. 51A). On an exposed area of the heat-resistant substrate 101 formed by a silicon wafer where the insulation layer 111 is not formed, the first silicon layer 112 and the second silicon layer 113 are selectively and epitaxitially grown in this order (FIG. 51B). At this stage, a silicon film is not formed on the insulation layer 111. Instead, the gap 114 is formed locally on the insulation layer 111. Through this gap 114, the insulation layer 111 is etched using hydracid fluoride (FIG. 51C). Following this, a mixture of hydracid fluoride, nitric acid and acetic acid is injected through a space where the gap 114 and the insulation layer 111 were removed so that the first silicon layer 112 is selectively etched and the second silicon layer 113 is separated from the heat-resistant substrate 101 due to a difference in etching speeds which is created by a difference in specific resistances (FIG. 51D). A bonding layer 105 is then formed, and the grid electrode 106 and the back surface electrode 107 are formed on the bonding layer 105 by sputtering of metal or other technique (FIG. 51E).

In the manufacturing method of the thin solar battery as above, processes such as selective etching of the first silicon layer 112 and selective epitaxial growth of the semiconductor film are not sufficiently reliable for mass production, which makes it difficult to reduce an overall cost. Further, even though the thin semiconductor film is used to improve the photo-conversion efficiency, since the electrodes are formed on the both sides of the semiconductor layer, the utilization efficiency of manufacturing light deteriorates because of the surface area which is used aiming to seat the electrodes on the light incident side.

A specific solar battery structure as that shown in FIG. 52 has already been proposed in Patent Laid-Open Gazette No. 6-053782 to deal with such problems. FIG. 52 is a cross sectional view partially showing a structure of this solar battery. In FIG. 52, a semiconductor film 2 is formed by a p-type polycrystal silicon film having a thickness of 60 $\mu$m and a specific resistance of about 1 $\Omega$cm, for instance. A bonding layer 122 is formed by diffusing n-type impurities such as phosphorus into the semiconductor film 2. The bonding layer 121 is also formed inside a through hole 114 which is formed in the semiconductor film 2. Electrodes for the bonding layer 122 may be a first electrode (n-type electrode) 127 made of silver or the like and a second electrode (p-type electrode) 128 made of aluminum or the like which is formed in a p-type area where the bonding layer 122 is not formed. Generated electricity is available outside through the electrodes 127 and 128. The semiconductor film 2 is adhered to a glass substrate 129 through a transparent adhesive 121. Light impinges upon from the glass substrate side. In a cell, i.e., a unit of this solar battery, the bonding layer is formed at least on a major surface of the semiconductor film 2 of the light incident side and on an inner wall of a through hole formed in the semiconductor film (for separation). Further, the first electrode 127 connected to the bonding layer is formed on the opposite side of the major surface of the semiconductor film. Hence, loss of the light receiving area due to the existence of the first electrode is less, whereby light energy is utilized efficiently. In addition, since the cell is not more than 100 $\mu$m in thickness, a material cost is largely reduced than in manufacturing of the conventional cell. The n-type and p-type electrodes 127 and 128 are formed on the opposite side of the light incident side, and therefore, in the case of connecting by forming tab electrodes, it is not necessary to connect the tabs from the front surface side to the back surface side of adjacent cells unlike in the conventional techniques. As a result, the connection step is largely simplified. Still further, Japanese Patent Laid-Open Gazette No. 6-053782 has already disclosed a method of separating a semiconductor film from a specific substrate, a method of forming a through hole in a semiconductor film, a method of forming p-type and n-type bonding layers and other methods.

The modularizing as above using a thin solar battery cell realizes both a higher efficiency owing to an increased light receiving area and a suppressed cost owing to a reduced material cost of a silicon material and simplified connection performed at the tab electrode forming step. While formation of electrodes on each cell is achieved by vacuum deposition or sputtering evaporation for each cell or by global printing with the cells arranged on a plane for modularizing, in global printing which efficiently forms electrodes, as the light receiving area increases, it becomes more difficult to ensure that the accuracy of printed masks, the location of an electrode to be printed and the configuration of each electrode does not exceed 100 $\mu$m.

Further, even though connection step is simplified at the tab electrode forming step, it is still necessary to repeat the step of forming electrodes for each cell, the step of forming tab electrodes for each cell and the step of connecting the cells to each other. For this reason, simplification of these steps has been desired.

Still further, as a solar battery cell becomes thinner, it became more difficult to handle a solar battery through the process of manufacturing a cell and the modularizing processes. As a result, due to damage by dropping and inadvertent handling, a deteriorated yield has became a problem. Handling requires an extremely long time to prevent such damage, which serves as an obstacle to improve the productivity.

SUMMARY OF THE INVENTION

A first aspect of the present invention is directed to a method of forming a thin solar battery in which semiconductor films formed on a specific substrate are separated from the substrate, an electrode is formed on the semiconductor films so that the semiconductor films will serve as a power generation layer, and a glass substrate is stacked on light incident surfaces of the semiconductor films, the method comprising the steps of: (a) coating the glass substrate with a transparent resin; (b) arranging the semiconductor films on the glass substrate which is coated with the transparent resin; and (c) forming electrodes by printing on the semiconductor films which are arranged on the glass substrate using a predetermined printing method.

According to a second aspect of the present invention, in the method of the first aspect, the step (a) of coating the glass substrate with the transparent resin comprises a step (a-1) of the transparent resin shaped like a sheet is disposed on the glass substrate and the glass substrate seating the transparent resin is passed between rollers so that the transparent resin is spread under pressure into a desired thickness and tightly adhered to the glass substrate.

According to a third aspect of the present invention, in the method of the second aspect, in the step (a-1), a vinyl sheet is disposed on the transparent resin, the transparent resin is sandwiched between the vinyl sheet and the glass substrate and passed between rollers, and the vinyl sheet is peeled off at a constant peeling angle $\theta$ after passing between the rollers, wherein the peeling angle $\theta$ satisfies a relation $0<\theta<10°$.

According to a fourth aspect of the present invention, in the method of the first aspect, in the step (a) of coating the glass substrate with the transparent resin, the transparent resin is disposed on the glass substrate and a blade is swept over a surface of the transparent resin so that the transparent resin of a desired thickness is tightly adhered to the glass substrate.

According to a fifth aspect of the present invention, in the method of the fifth aspect, the transparent resin contains transparent corpuscles.

According to a sixth aspect of the present invention, in the method of the sixth aspect, the transparent corpuscles are shaped like pearls and each have a diameter which is approximately the same as the thickness of the transparent resin after coating.

According to an seventh aspect of the present invention, in the method of the first aspect, in the step (b) of arranging the semiconductor films on the glass substrate which is coated with the transparent resin, a grid frame is placed to face a front surface of the transparent resin and a plurality of the semiconductor films are disposed on the glass substrate which is coated with the transparent resin utilizing a grid pattern of the grid frame.

According to a eighth aspect of the present invention, in the method of the first aspect, in the step (c) forming electrodes by printing on the semiconductor films which are arranged on the glass substrate using the predetermined printing method, the predetermined printing method is a screen printing method or a pad printing method.

According to a ninth aspect of the present invention, in the method of the ninth aspect, the step (c) forming electrodes by printing on the semiconductor films which are arranged on the glass substrate using the predetermined printing method comprises a step (c-1) of drying the electrodes which are printed, printing and drying of the electrodes are repeated to form the electrodes on a plurality of the semiconductor films which are arranged on the glass substrate while performing a process of forming one electrode on one semiconductor film of the plurality of the semiconductor films is other than a process of forming another electrode on another semiconductor film thereof which is adjacent to the one semiconductor film.

According to an tenth aspect of the present invention, in the method of the tenth aspect, in the step (c-1) of drying the electrodes which are printed, the semiconductor films are heated through the glass substrate by a heater which is attached to a printer.

According to a eleventh aspect of the present invention, in the method of the ninth aspect, in the step (c) forming electrodes by printing on the semiconductor films which are arranged on the glass substrate using the predetermined printing method, through holes are formed in the semiconductor films for separation from the substrate or formation of the electrodes, and an electrode printing mask and the semiconductor films are aligned to each other using the through holes and an alignment marker which is formed at a desired position in the electrode printing mask.

According to a twelfth aspect of the present invention, the method of the first aspect further comprises the steps of: (d) printing a solder on a tab electrode formation area for connecting a plurality of the electrodes which are formed on the semiconductor films; and (e) disposing a monolithic tab electrode member, which has pattern which corresponds to the area with the solder printed, on the area with the solder printed to thereby form tab electrodes.

According to a thirteenth aspect of the present invention, in the method of the first aspect, the semiconductor films which are separated from a specific substrate are sucked with pressure which does not exceed the destruction strength of the semiconductor films to handle the semiconductor films.

According to a fourteenth aspect of the present invention, in the method of the first aspect, the semiconductor films are made of silicon.

An fifteenth aspect of the present invention is directed to an apparatus for forming a thin solar battery in which semiconductor films formed on a specific substrate are separated from the substrate, an electrode is formed on the semiconductor films so that the semiconductor films will serve as a power generation layer, and a glass substrate is stacked on light incident surfaces of the semiconductor films, the apparatus comprises a handling apparatus for transporting and handling the semiconductor films which are separated from the specific substrate so that the semiconductor films are conveyed to a next process step, and wherein the handling apparatus, which is an automatic transformation robot, comprises a suction mechanism for sucking the semiconductor films with pressure which does not exceed the destruction strength of the semiconductor films to handle the semiconductor films.

According to a sixteenth aspect of the present invention, in the apparatus of the eighteenth aspect, the handling apparatus comprises a ring portion having an outer diameter smaller than an inscribed circle of the semiconductor films to be sucked and a suction groove of a specific width is formed in a suction surface of the ring portion and is linked to the suction mechanism which sucks the semiconductor films.

According to a seventeenth aspect of the present invention, in the apparatus of the eighteenth aspect, a surface for sucking the semiconductor films of the handling apparatus is formed by a perforated material.

According to an eighteenth aspect of the present invention, in the apparatus of the eighteenth aspect, the handling apparatus comprises a storage cassette for transporting a plurality of the semiconductor films which are sucked to a next process step at one time.

According to a nineteenth aspect of the present invention, in the apparatus of the twenty-first aspect, the storage cassette comprises a partition plate having a meshed structure.

According to a twentieth aspect of the present invention, in the apparatus of the twenty-first aspect, the width of the storage cassette becomes wider toward an entrance of the storage cassette, and the storage cassette further comprises a semiconductor film insertion guide.

In the method of manufacturing a thin solar battery according to the first aspect of the present invention, the semiconductor films are arranged on the glass substrate which is coated with the transparent resin at the step (b), these thin semiconductor films are fixed. Hence, electrodes are formed stably at one time on such semiconductor films, which in turn simplifies the manufacturing processes. Further, since the modularized thin solar battery is carefully stacked on the glass substrate which serves as the window member as in the conventional techniques, a possibility of damaging the semiconductor films during manufacturing is reduced and the yield is improved.

In the method of manufacturing a thin solar battery according to the second aspect of the present invention, the glass substrate seating the transparent resin is pressed between the rollers. Hence, only if the distance between the rollers is properly set, the transparent resin is uniformly spread into a desired thickness and adhered to the glass substrate at a high accuracy. Thus, it is possible to manufacture an accurate solar battery.

In the method of manufacturing a thin solar battery according to the third aspect of the present invention when the glass substrate seating the transparent resin is pressed between the rollers, the vinyl sheet is disposed on the surface of the transparent resin. The transparent resin sandwiched by the vinyl sheet and the glass substrate is spread under pressure and the vinyl sheet is peeled off at a predetermined peeling angle. Hence, the transparent resin after spread under pressure has a smoother and more uniform surface. Thus, it is possible to manufacture an accurate solar battery.

In the method of manufacturing a thin solar battery according to the third aspect of the present invention, since the peeling angle at which the vinyl sheet is peeled off from the spread transparent resin is set 10° or smaller, force in a normal line direction created by peeling off in the surface of the transparent resin is suppressed to the adhesion force between the transparent resin and the glass substrate or less. Hence, only the vinyl sheet is peeled off without causing the transparent resin to separate from the glass substrate. Thus, it is possible to manufacture an accurate solar battery and improve the yield.

In the method of manufacturing a thin solar battery according to the forth aspect of the present invention, since the blade is swept over the surface of the transparent resin which is disposed on the glass substrate at the step (a), a transparent resin of a low viscosity is adhered in a uniform thickness to the glass substrate and the manufacturing processes are simplified.

In the method of manufacturing a thin solar battery according to the fifth aspect of the present invention, since the transparent resin to coat the glass substrate contains the transparent corpuscles, the gap between the semiconductor films and the glass substrate is maintained because of the size of the corpuscles. The corpuscles also serves to prevent the semiconductor films arranged on the transparent resin from sinking into the transparent resin. As a result, an accurate solar battery is manufactured.

In the method of manufacturing a thin solar battery according to the sixth aspect of the present invention, the transparent corpuscles added to the transparent resin to coat the glass substrate are shaped like pearls and have a diameter which is approximately the same as the thickness of the transparent resin after coating. Hence, the gap between the semiconductor films and the glass substrate is maintained as designed. The corpuscles existing between the plurality of the semiconductor films which are arranged on the transparent resin or in the vicinity of the through holes which are formed in the semiconductor films restrict movement of the resin and suppresses oozing of the resin between the plurality of the semiconductor films or into the through holes which are formed in the semiconductor films. Further, since corpuscles are shaped like pearls, when the transparent resin is disposed for coating, the diameter of the corpuscles controls the thickness of the transparent resin which is to be disposed at a low resistance. Hence, it is possible to manufacture an accurate solar battery and improve the yield.

In the method of manufacturing a thin solar battery according to the seventh aspect of the present invention, the grid frame is placed to face the transparent resin which is disposed, and the plurality of the semiconductor films are placed on the transparent resin utilizing the frame. Hence, the semiconductor films are arranged accurately at desired positions on the transparent resin, which makes it possible to manufacture an accurate solar battery.

In the method of manufacturing a thin solar battery according to the eighth aspect of the present invention, since the electrodes are formed on the semiconductor films by screen printing or pad printing, the electrodes are formed accurately and easily. Hence, manufacturing of a solar battery is not expensive.

In the method of manufacturing a thin solar battery according to the ninth aspect of the present invention, printing and drying of the electrodes are repeated while performing a process of forming one electrode on one semiconductor film of the plurality of the semiconductor films is other than a process of forming another electrode on another semiconductor film thereof which is adjacent to the one semiconductor film. Hence, when a specific semiconductor film electrode is printed using a printing mask, no electrodes are yet formed or the electrodes are already dry on an adjacent semiconductor film. This eliminates a possibility that the printing paste adheres to other portion through the printing mask. Thus, the configuration accuracy of the electrodes is maintained, the manufacturing processes are simplified, and an accurate solar battery is manufactured.

In the method of manufacturing a thin solar battery according to the tenth aspect of the present invention, when the electrodes are formed on the semiconductor films, the semiconductor films are heated through the glass substrate by the heater which is mounted to the printer. After the printing step at a certain time, the printed electrodes are dried while the stage or the printing mask is moved and the electrode are printed on the next semiconductor film. Thus, there is no need to especially ensure a drying time, which makes it possible to complete the electrode formation step at a high accuracy in a short time and to improve the manufacturing efficiency.

In the method of manufacturing a thin solar battery according to the eleventh aspect of the present invention, when the electrodes are printed on the semiconductor films, the electrode printing mask and each semiconductor film are aligned to each other utilizing a relative relationship between the alignment marker which is formed at a desired position in the electrode printing mask and the through hole which is formed in the semiconductor film. Hence, the accuracy of printing the electrodes at a desired position is improved and an accurate solar battery is manufactured.

The method of manufacturing a thin solar battery according to the twelfth aspect of the present invention further comprises the step (d) of printing a solder on a tab electrode formation area for connecting a plurality of the electrodes which are formed on the semiconductor films, and (e) disposing a monolithic tab electrode member, which has pattern which corresponds to the area with the solder printed, on the area with the solder printed to thereby form tab electrodes. Hence, one solder printing step and one tab electrode formation step complete formation of the tab electrodes within the solar battery cells or within the solar battery module in which a plurality of solar battery cells are arranged. Thus, the number of process steps needed is greatly reduced, which in turn reduces a cost and improves the productivity.

In the method of manufacturing a thin solar battery according to the thirteenth aspect of the present invention, since the semiconductor films separated from the specific substrate are sucked and treated by the force which does not exceed the destruction strength of the semiconductor films, the semiconductor films are transported to the next step without damaging the semiconductor films. This improves the yield.

In the method of manufacturing a thin solar battery according to the fourteenth aspect of the present invention, since the semiconductor films are made silicon, well established manufacturing processes are used to manufacture the thin solar battery and the yield is improved.

In the method of manufacturing a thin solar battery according to the fifteenth aspect of the present invention, the handling apparatus for transporting and handling the semiconductor films separated from the specific substrate to the next step comprises the suction mechanism which sucks the semiconductor films with the force which does not exceed the destruction strength of the semiconductor films. Hence, the semiconductor films are transported to the next step without damaging the semiconductor films. This improves the yield.

In the method of manufacturing a thin solar battery according to the fifteenth aspect of the present invention, the handling apparatus is an automatic transportation robot which includes the suction mechanism. Hence, accurate handling is possible and the yield is improved.

In the method of manufacturing a thin solar battery according to the sixteenth aspect of the present invention, in the handling apparatus comprising the suction mechanism, the ring portion is disposed which has an outer diameter which is smaller than an inscribed circle of the semiconductor films to be sucked. The suction groove linked to the suction mechanism and having a specific width is formed in the suction surface of the ring portion to suck the semiconductor films. Hence, there is no force which is applied locally to the semiconductor films, and therefore, with a simple structure, the semiconductor films are transported to the next step without damaging the semiconductor films. With this simple structure, the yield is improved.

In the method of manufacturing a thin solar battery according to the seventeenth aspect of the present invention, in the handling apparatus comprising the suction mechanism, the surface at which the semiconductor films are sucked is formed by a perforated material. Hence, with this even simpler structure, there is no force which is applied locally to the semiconductor films, and therefore, the semiconductor films are transported to the next step without damaging the semiconductor films. With this simple structure, the yield is improved.

In the method of manufacturing a thin solar battery according to the eighteenth aspect of the present invention, in the handling apparatus comprising the suction mechanism, the storage cassette is disposed for transporting a plurality of sucked semiconductor films at one time to the next step. Since the semiconductor films which are stored in the cassette are handled in the unit of cassette, the semiconductors are transported and stored without any damage. This improves the productivity.

In the method of manufacturing a thin solar battery according to the nineteenth aspect of the present invention, the storage cassette comprises a mesh partition plate. Hence, the semiconductor films are transported and stored without warping or distortion of the semiconductor films. This improves the yield.

In the method of manufacturing a thin solar battery according to the twentieth aspect of the present invention, the width of the storage cassette becomes wider toward the entrance of the storage cassette through which the semiconductor films are inserted. The storage cassette comprises the semiconductor film insertion guide. This prevents chipping when the semiconductor film are inserted and improves the yield.

Accordingly, it is an object of the present invention to obtain a thin solar battery manufacturing method in which it is possible to accurately form an electrode for each solar battery cell which is modularized to increase a light receiving area and it is possible to manufacture a thin solar battery cell and a module at a low cost.

It is another object of the present invention to obtain a thin solar battery manufacturing method in which it is possible to simplify modularizing steps starting from a step of forming an electrode for a solar battery cell until a step of connecting cells to each other and it is possible to manufacture a thin solar battery cell and a module at a low cost.

It is still further object of the present invention to obtain a thin solar battery manufacturing method and a thin solar battery manufacturing apparatus in which it is possible to easily handle a thin solar battery cell and to increase a productivity of production of a thin solar battery cell and a module at a low cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view showing manufacturing processes of a thin solar battery according to a first preferred embodiment of the present invention;

FIG. 39 is a view showing a position of a tab to be formed in the electrode pattern of each actual solar battery cell in the twelfth preferred embodiment of the present invention;

DESCRIPTION OF THE PREFERRED EMBODIMENTS

First Preferred Embodiment

Figure 2A:
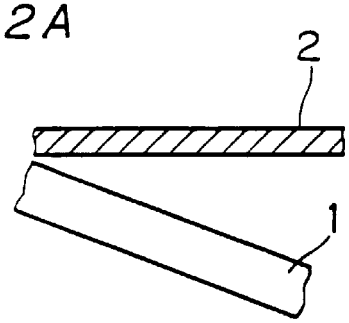
FIGS. 2A to 2E are views describing a manufacturing method of a thin solar battery according to a second preferred embodiment of the present invention, particularly describing a method of uniformly coating a glass substrate with a transparent resin at a step SB of the first preferred embodiment.
Figure 2B:
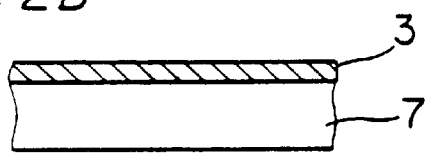
Figure 2C:
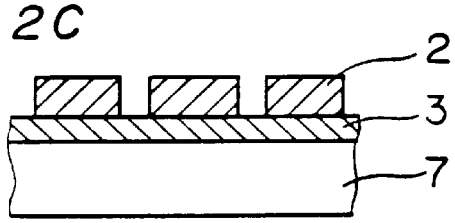
Figure 2D:
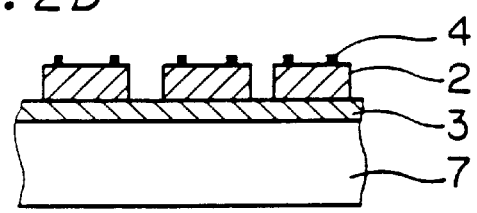
Figure 2E:
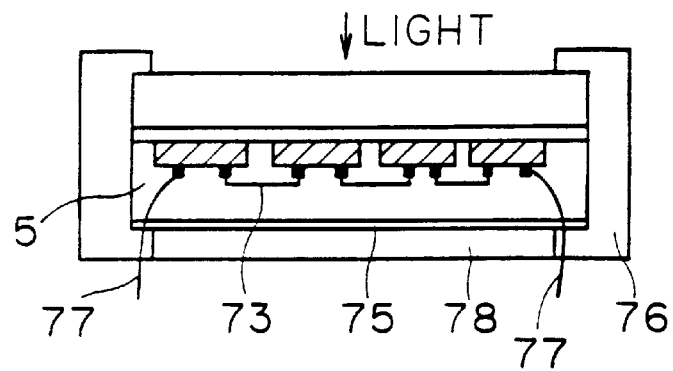

In the following, a first preferred embodiment of the present invention will be described with reference to associated drawings. FIG. 1 shows a part of a modularizing process of a solar battery which includes a semiconductor film not exceeding 100 $\mu$m in thickness, e.g., a silicon film having such a thickness, as a power generation layer. FIGS. 2A to 2E are cross sectional views showing processes which correspond to the respective processes of FIG. 1. First, as shown in FIG. 2A, a semiconductor film (silicon film) 2 is formed on a particular substrate such as a silicon substrate 1, and the semiconductor film 2 is separated from the silicon substrate 1 (Step SA). Next, as shown in FIG. 2B, a glass substrate 7 which will serve as a window for transmitting incident light when modularized is coated with a transparent resin 3 in a desired uniform thickness, and the glass substrate 7 and the transparent resin 3 are adhered to each other in a tight contact (Step SB). Following this, the semiconductor film 2 once separated at the step SA is disposed on the transparent resin 3 in accordance with a pattern of modularizing, whereby the semiconductor film 2 is placed and adhered onto the transparent resin 3 as shown in FIG. 2C (Step SC). As shown in FIG. 2D, a pattern of an electrode 4 of a desired thickness and a desired configuration is formed on the semiconductor film 2 which is disposed on the transparent resin 3. The electrode 4 is formed by printing a paste made of an electrode material by screen printing or pad printing and by thereafter drying the printed electrode at a predetermined temperature (Step SD). Next, as shown in FIG. 2E, a modularized thin solar battery is completed by forming a tab electrode 73 and a desired wiring line 77 on the structure already comprising the electrode, molding with a sealing resin 5, and by disposing a tetrafilm 75, a back plate 78, a frame 76 and etc. If necessary, a through hole is formed in the silicon film 2 which is to be separated at the step SA to use the through hole for both separating and forming the electrode.

Second Preferred Embodiment

Figure 3A:
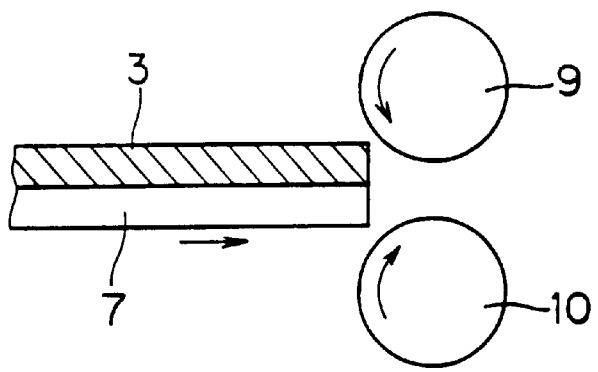
FIGS. 3A to 3E are views describing the manufacturing method of a thin solar battery according to the second preferred embodiment of the present invention, particularly describing another method of uniformly coating a glass substrate with a transparent resin at the step SB of the first preferred embodiment.
Figure 3B:
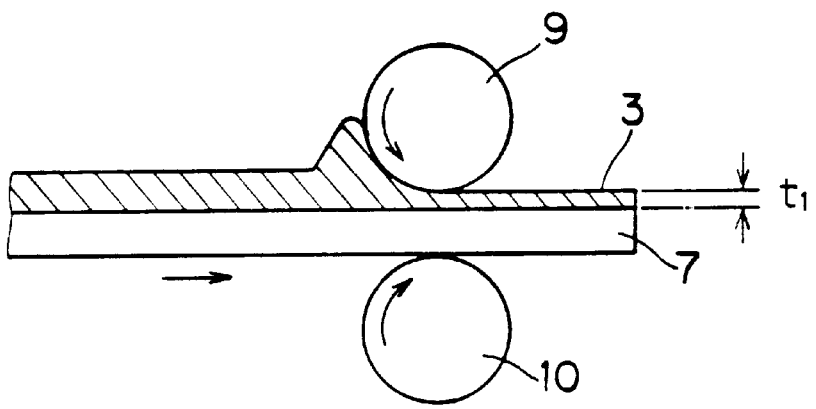
Figure 3C:
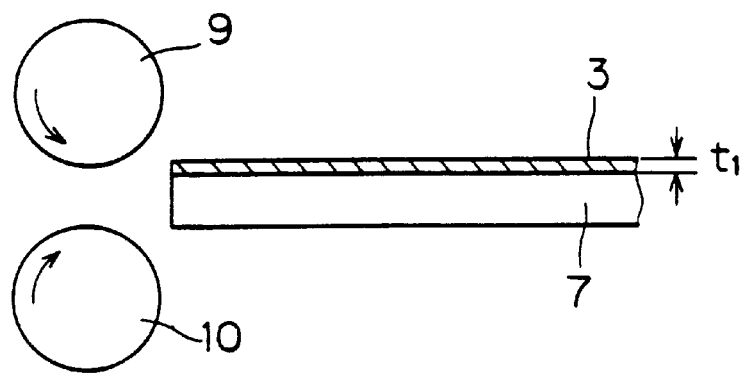

Now, a second preferred embodiment of the present invention will be described with reference to associated drawings. FIGS. 3A to 3C show a method of uniformly coating the glass substrate with the transparent resin at a step SB of the first preferred embodiment. FIGS. 3A to 3C show a manner in which the transparent resin 3 stacked on the glass substrate 7 passes between smooth roller surfaces of an upper roller 9 and a lower roller 10 which are attached to a transparent resin coating apparatus. The state shown in FIG. 3A is where the transparent resin 3 stacked on the glass substrate 7 is ready for insertion into a nip between the rolling upper and lower rollers 9 and 10. The glass substrate with the transparent resin thereon is inserted between the rolling upper and lower rollers 9 and 10, spreading the transparent resin under pressure into a desired thickness t and a tight contact with the glass substrate 7 (FIG. 3B). When the glass substrate 7 has passed between the rollers 9 and 10, the transparent resin 3 of an uniform thickness t1 is in a tight contact with the glass substrate 7 as shown in FIG. 3C completing coating of the resin.

Figure 3D:
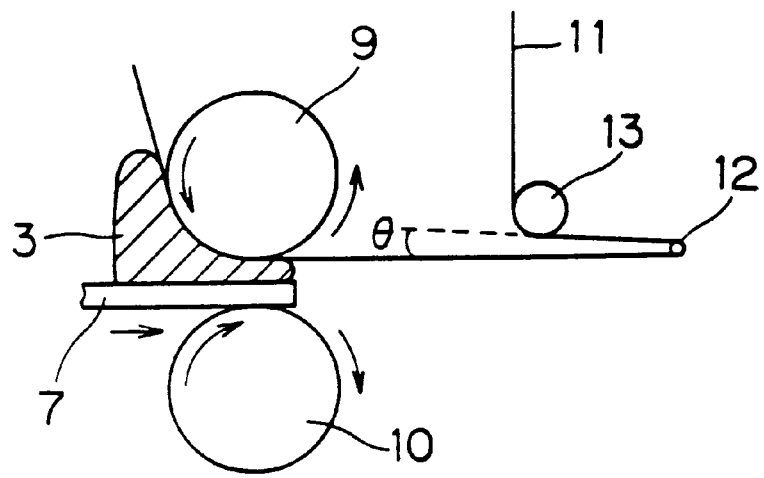
Figure 3E:
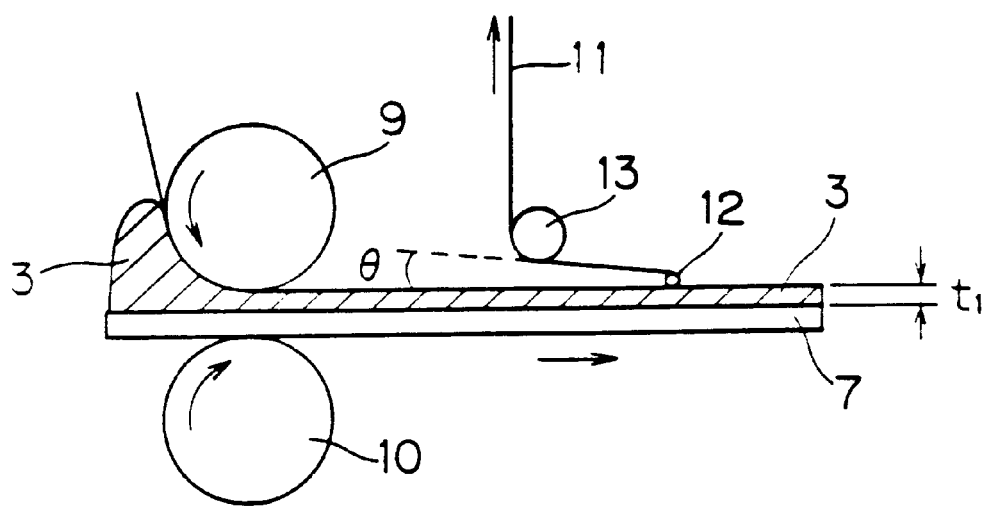

Now, a description will be given on a case where the transparent resin 3 is pressed under pressure while placing a vinyl sheet on a surface of the transparent resin 3. FIGS. 3D and 3E show a method of uniformly coating the glass substrate with the transparent resin at the step SB of the first preferred embodiment. As shown in FIGS. 3D and 3E, the transparent resin 3 is stacked on the glass substrate 7 with a vinyl sheet 11 such as a vinyl chloride interposed, and passes between the smooth roller surfaces of the upper roller 9 and the lower roller 10 which are attached to a transparent resin coating apparatus. FIG. 3D shows the glass substrate with the transparent resin stacked thereon as it is inserted between the rolling upper and lower rollers 9 and 10. In FIG. 3D, a first guide roller 12 and a second guide roller 13 are used to separate the vinyl sheet 11 from the surface of the transparent resin 3 after passing through the rollers 9 and 10. Guided by the first guide roller 12 and the second guide roller 13, the vinyl sheet 11 is separated from the resin and wound up by a winder (not shown) of the transparent resin coating apparatus. The second guide roller 13 defines a peeling angle θ at which the vinyl sheet 11 is peeled off from the resin. Next, the glass substrate with the transparent resin stacked thereon is inserted between the rolling upper and lower rollers 9 and 10, whereby the transparent resin is spread under pressure into a desired thickness t1 and a tight contact with the glass substrate 7. Where the transparent resin is spread under pressure, the vinyl sheet 11 is peeled off from the transparent resin at the location of the first guide roller 12 at the angle θ which is defined between the second guide roller 13 and the surface of the transparent resin 3 (FIG. 3E). Thus, the transparent resin 3 of an uniform thickness t1 is tightly pressed against the glass substrate 7 while removing the vinyl sheet 11 from the resin surface, thereby completing coating of the resin. Use of the vinyl sheet 11 allows the transparent resin to have an even smoother surface than when pressed directly by the rollers.

The second preferred embodiment preferably uses a resin of a large viscosity specifically about 10,000 P or more. For example, SOTEFA available from TORAY DOW CORNING SILICON) is appropriate.

A gap between the upper and lower rollers 9 and 10 is set so that the thickness of the transparent resin after pressing becomes 400 μm or larger. An unevenness tolerable for such a thickness needs be at most 50 μm. When the peeling angle θ is large, adhesion between the vinyl sheet 11 and the transparent resin prevents smooth separation of the vinyl sheet 11 from the surface of the transparent resin 3 and deteriorates the smoothness of the surface of the transparent resin 3 after separation of the vinyl sheet 11. An experiment has confirmed that an unevenness of at most 50 μm is possible by setting the peeling angle θ at about 10° or less. A resin which has a vinyl sheet from the beginning may be used. Alternatively, the vinyl sheet 11 may be disposed on the transparent resin during the resin coating process or before the resin coating process.

Third Preferred Embodiment

Figure 4A:
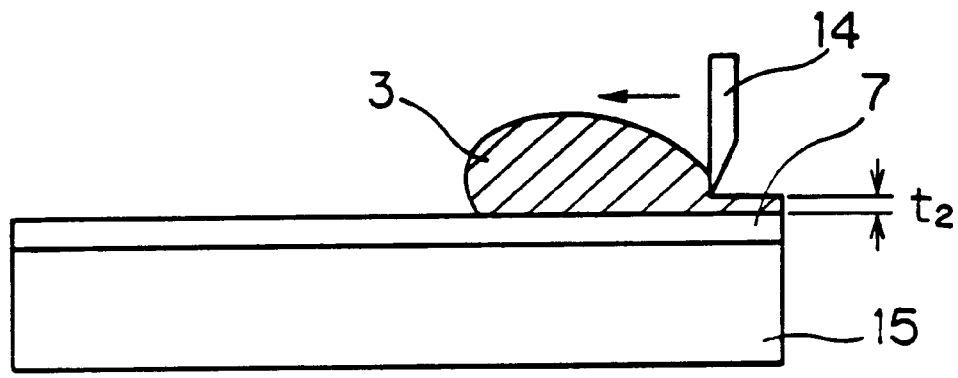
FIGS. 4A and 4B are views describing a manufacturing method of a thin solar battery according to a third preferred embodiment of the present invention, particularly describing a method of uniformly coating a glass substrate with a transparent resin at the step SB of the first preferred embodiment in a manner different from that in the second preferred embodiment.
Figure 4B:
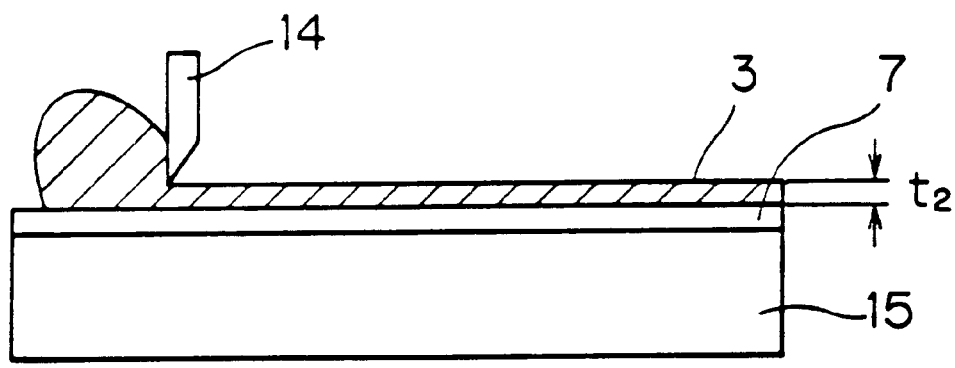

Now, a third preferred embodiment of the present invention will be described with reference to another set of associated drawings. FIGS. 4A and 4B show a method of uniformly coating the glass substrate with the transparent resin at the step SB of the first preferred embodiment. Denoted generally at 15 is a suction stage for holding the glass substrate 7 by suction force. FIGS. 4A and 4B show a manner in which a blade 14 uniformly spreads the transparent resin on the surface of the glass substrate 7 which is held by the stage 15.

The state shown in FIG. 4A is immediately after coating of the transparent resin 3 is started. In FIG. 4A, the blade sweeps over a surface of the transparent resin 3 in one direction which is placed on an edge of the glass substrate and spreads the transparent resin into a uniform thickness. The state shown in FIG. 4B is immediately before the end of the coating process. The transparent resin is spread into a uniform thickness t2 on the glass substrate. Instead of moving the blade 14 as performed in this embodiment, the blade 14 may be fixed and the stage may be moved relative to the blade 14. A gap between the blade 14 and the surface of the glass substrate 7 is adjusted so that the transparent resin eventually has the desired thickness t2.

The third preferred embodiment is suitable to where a resin of a low viscosity, specifically not exceeding 20 P, is to be spread into a thickness (t2) not more than 15 μm. For instance, a resin mainly consisting of siloxane polydimethyl (silicon) is appropriate.

Fourth Preferred Embodiment

Figure 5:
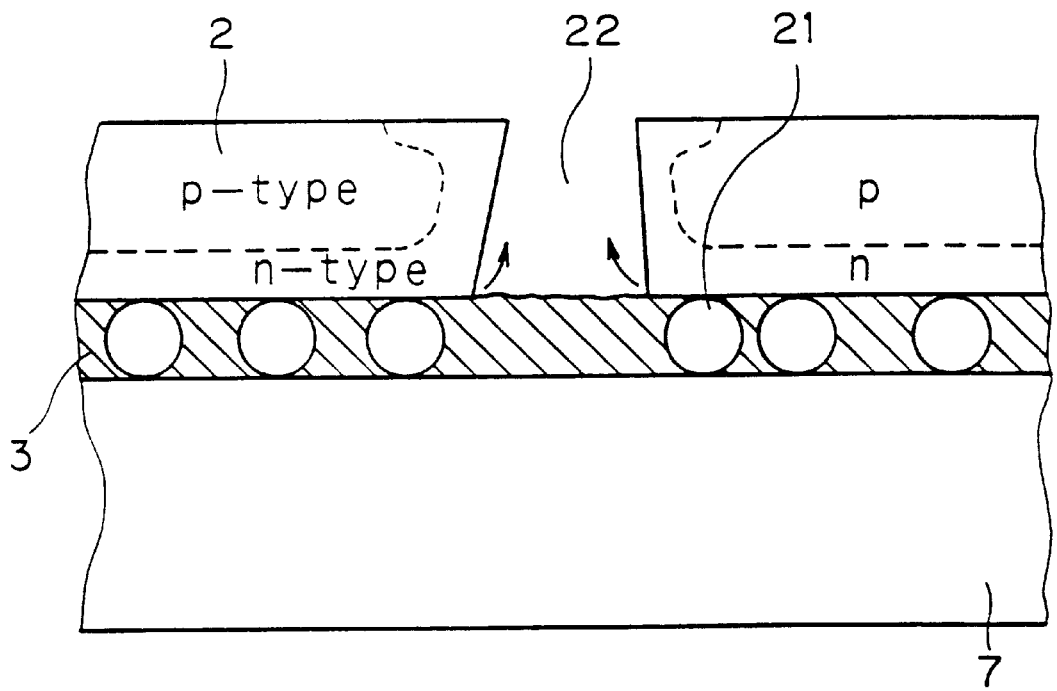
FIG. 5 is a cross sectional view describing a manufacturing method of a thin solar battery according to a fourth preferred embodiment of the present invention, particularly describing an effect created by corpuscles within the transparent resin.

Now, a fourth preferred embodiment of the present invention will be described with reference to an associated drawing. FIG. 5 is a cross sectional view of a structure in which the glass substrate 7 and the semiconductor film 2 are bonded to each other using the transparent resin 3 which contains pearl-like shaped transparent corpuscles 21. In FIG. 5, denoted at 22 is one of through holes which are formed at equal intervals all over the semiconductor film 2.

The corpuscles are preferably SiO2 corpuscles such as glass beads, for example. The transparent resin 3 containing the corpuscles 21 may be coated in the manner as that in the third preferred embodiment. During the coating process, restricted by the diameter of the corpuscles 21, the thickness of the transparent resin 3 is easily controlled. Further, since the corpuscles 21 smoothly move over the glass substrate 7, it is possible to spread the transparent resin 3 still at a low resistance even though using the corpuscles 21.

Next, an effect of adding the pearl-like shaped corpuscles 21 to the transparent resin 3 will be described. The diameter of the pearl-like shaped corpuscles 21 is set 15 μm or less, depending on a designed thickness of the resin to be spread. For example, the corpuscles 21 are uniformly mixed with the transparent resin 3 which has a viscosity not exceeding 20 P and spread with the transparent resin 3 on the glass substrate 7 by the blade 14 which is used in the third preferred embodiment. The semiconductor film 2 including the through hole 22 is then disposed on the transparent film 3 after the coating process. It is to be noted here that the resin having a low viscosity tends to ooze into the through hole 22 and then onto the semiconductor film 2 as shown by arrows in FIG. 5, thereby causing the semiconductor film 2 to sink down onto the bottom of the transparent resin 3. However, in the fourth preferred embodiment, the corpuscles near the through hole 22 prevent the transparent resin 3 from oozing into the through hole 22. In addition, the pearl-like shaped corpuscles 21, which have a diameter equal to the thickness of the transparent resin 3, maintain a gap between the semiconductor film 2 and the modularizing glass 7.

Fifth Preferred Embodiment

Figure 6:
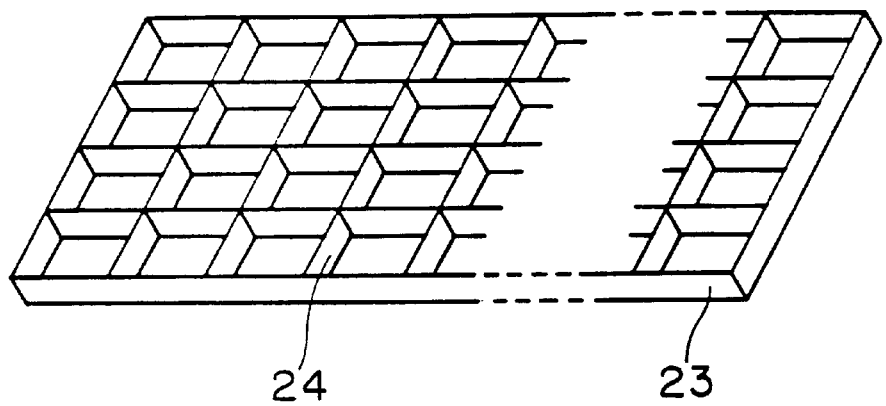
FIG. 6 is a view showing a structure of an instrument which is used to manufacture a thin solar battery according to a fifth preferred embodiment of the present invention.

Now, a fifth preferred embodiment of the present invention will be described with reference to associated drawings. FIG. 6 shows a structure of an instrument which is used to desirably arrange the semiconductor films 2 on the glass substrate 7 which is coated with the transparent resin 3. In accordance with the arrangement of the semiconductor films 2 on which a number of solar battery cells are to be formed to preferably modularize a solar battery, a grid frame 23 consists of partitioned spaces each defined by a taper 24 so that it is easy to arrange the semiconductor films 2 on the glass substrate 7 which is coated with the transparent resin 3.

Figure 7A:
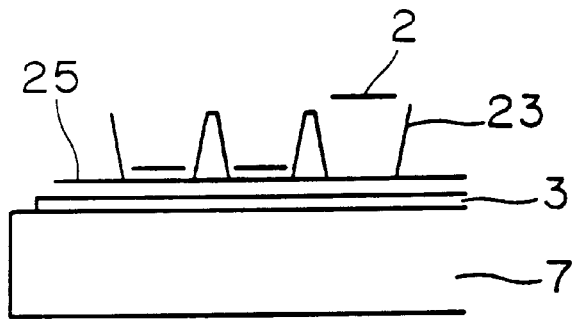
FIGS. 7A to 7D are views describing a manufacturing method of a thin solar battery according to the fifth preferred embodiment of the present invention, particularly describing a process of placing a semiconductor film on the transparent resin using the instrument shown in FIG. 6.
Figure 7B:
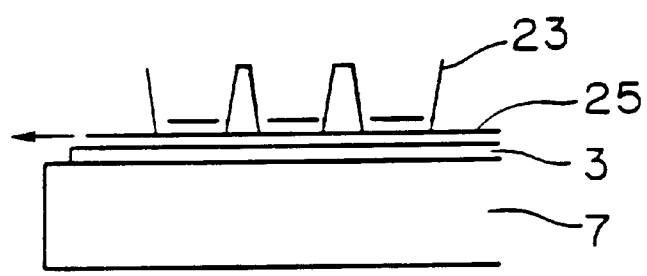
Figure 7C:
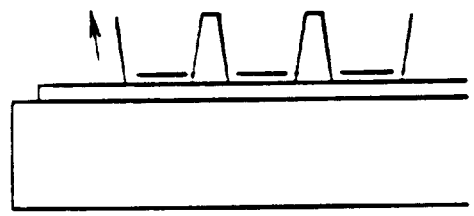
Figure 7D:
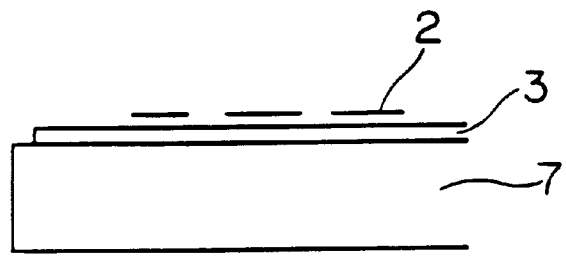

FIGS. 7A to 7D are views showing a manner in which the semiconductor films 2 are disposed on the glass substrate 7 which is coated with the transparent resin 3 using the grid frame 23. First, the semiconductor films 2 such as a number of an Si films contained in a cassette or the like are prepared. The grid frame 23 is then held at a desired position above the glass substrate 7 which is coated with the transparent resin 3 with a certain distance from the transparent resin 3. Next, after placing an intermediate sheet 25 between the transparent resin 3 with and the grid frame 23, the semiconductor films 2 are set in each grid cell on the intermediate sheet 25. In mass production in general, a robot retrieves the semiconductor films 2 from a cassette to set the semiconductor films 2. The glass substrate 7 is mounted on a precision stage which has a positioning accuracy not exceeding ±0.1 mm. The semiconductor films 2 are set in the grid cells accurately at a high speed since the robot and the stage are both driven. During setting of the semiconductor films 2 into the grid cells, no damage to the semiconductor films was confirmed even when the semiconductor films were dropped at a height about 1 mm above the intermediate sheet 25 (FIG. 7A). The intermediate sheet 25 is removed after arranging a predetermined number of the semiconductor films 2 which is needed to form a solar battery module (FIG. 7B). Next, the grid frame is removed (FIG. 7C), completing the process of arranging the semiconductor films each at desired position on the glass substrate 7 which is coated with the transparent resin 3 (FIG. 7D).

Figure 8A:
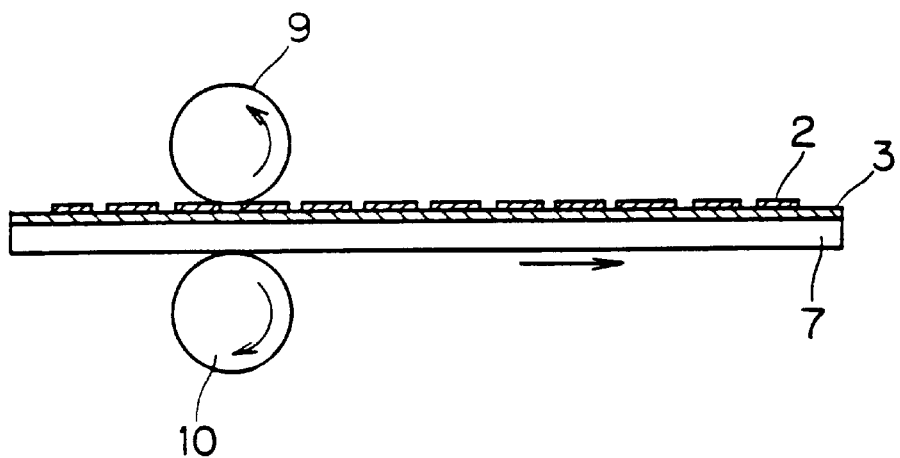
FIGS. 8A and 8B are views showing a deaeration process which is performed as post processing in the fifth preferred embodiment of the present invention.
Figure 8B:
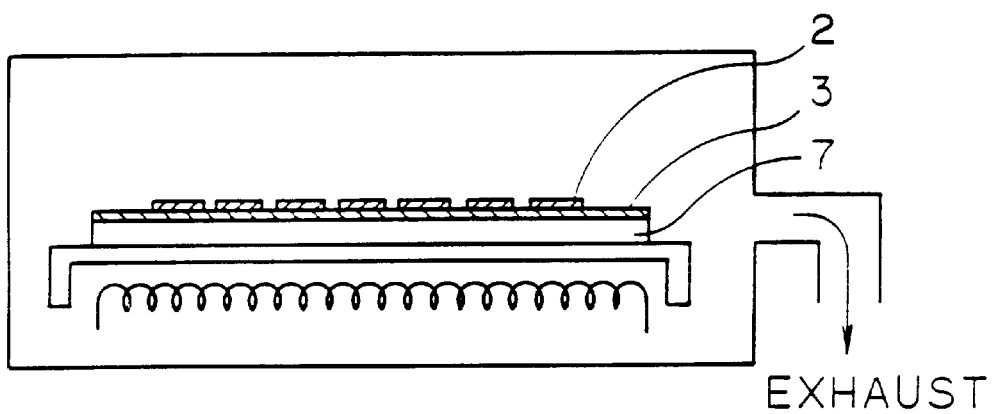

After arranging the semiconductor films 2, the semiconductor films 2 are heated to a predetermined temperature for adhesion to the glass substrate 7 and removal of air bubbles contained in the transparent resin 3 and deaerated at the same time when the transparent resin 3 is hardened. FIGS. 8A and 8B are conceptual views describing this process. FIG. 8A shows a deaeration process dealing with the transparent resin 3 which is configured in the form of a sheet. As in press rolling of the transparent resin 3, the transparent resin 3 is passed through rollers which are heated to about 130° C. FIG. 8B shows a deaeration process dealing with the transparent resin 3 which has a low viscosity. In FIG. 8B, the transparent resin 3 is heated in a vacuum chamber while removing air from the chamber after arranging the semiconductor films 2.

Sixth Preferred Embodiment

Figure 9A:
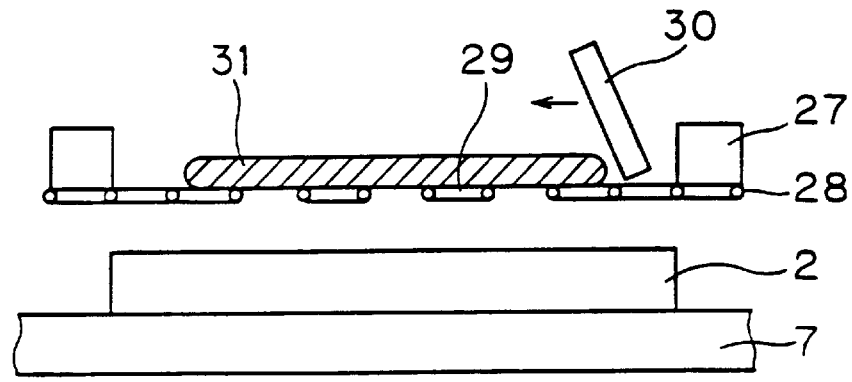
FIGS. 9A and 9B are explanatory diagrams of the principles of screen printing which is performed to manufacture a thin solar battery according to a sixth preferred embodiment of the present invention.
Figure 9B:
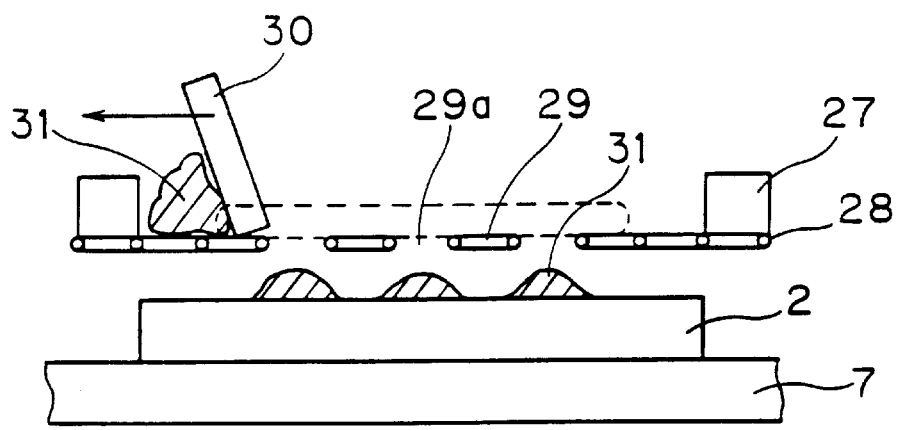
Figure 10A:
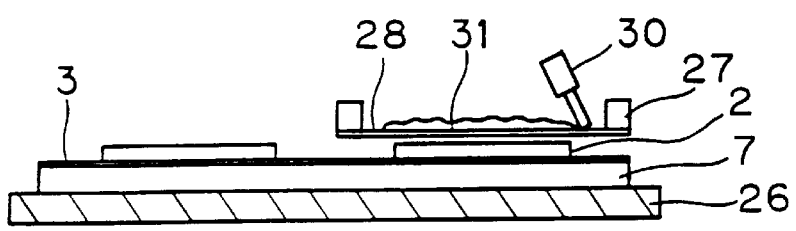
FIGS. 10A to 10C are views describing a process of forming an electrode by screen printing during manufacturing of the thin solar battery according to the sixth preferred embodiment of the present invention.
Figure 10B:
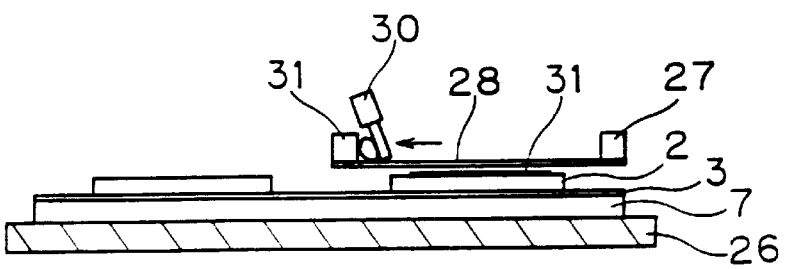
Figure 10C:
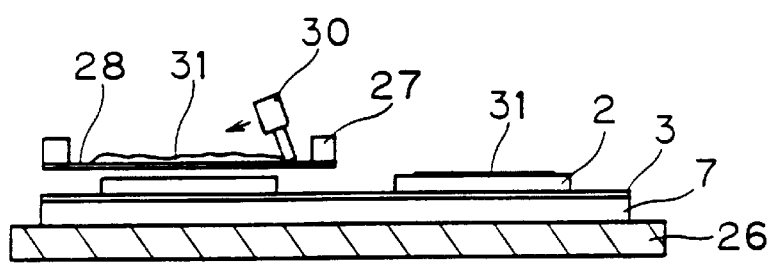

Now, a sixth preferred embodiment of the present invention will be described with reference to associated drawings. FIGS. 9A and 9B are views showing principles of screen printing while FIGS. 10A to 10C are views showing a process of forming electrodes on the semiconductor films 2 such as Si films, which corresponds to the step SD of FIG. 1 and FIG. 2D. The explanatory diagrams in FIGS. 10A to 10C show an electrode formation process utilizing screen printing. In FIGS. 9A and 9B and FIGS. 10A to 10C, a mask 29 which corresponds to a desired electrode pattern is placed on a mesh mask 28 which is stretched on a printing mask frame 27, and a printing paste 31 made of Ag, Al or other suitable material is placed on the mask 29. A squeegee 30 is moved over the mesh mask 28 to squeeze out the printing paste 31 through the mesh mask 28 in the pattern of openings 29a which are formed in the mask 29, thereby printing a desired pattern on the semiconductor films 2.

Next, these manufacturing processes will be described. As shown in FIG. 10A, a stage 26 seating the glass substrate 7 to which the semiconductor films 2 are adhered is moved so that the printing mask frame 27 is aligned to a desired position above one of the semiconductor films 2. As described earlier, the stage needs be accurately stopped with an accuracy preferably within ±0.1 mm. The mesh mask 28 is coated with the printing paste 31. As shown in FIG. 10B, the printing mask frame 27 is fine positioned so that this semiconductor film 2 and the pattern of the mesh mask 28 are aligned to each other at a desired position at a desired positional accuracy, and the printing paste 31 is printed on semiconductor film 2 by moving the squeegee 30. Next, the stage 26 is moved to position the printing mask frame 27 above the next semiconductor film 2 as shown in FIG. 10C. This is repeated to accurately form the electrode pattern on every semiconductor film 2 arranged within the solar battery module. The accuracy to stop driving of the stage 26 may not be very high if fine positioning of the printing mask frame 27 is accurate.

Seventh Preferred Embodiment

Figure 11A:
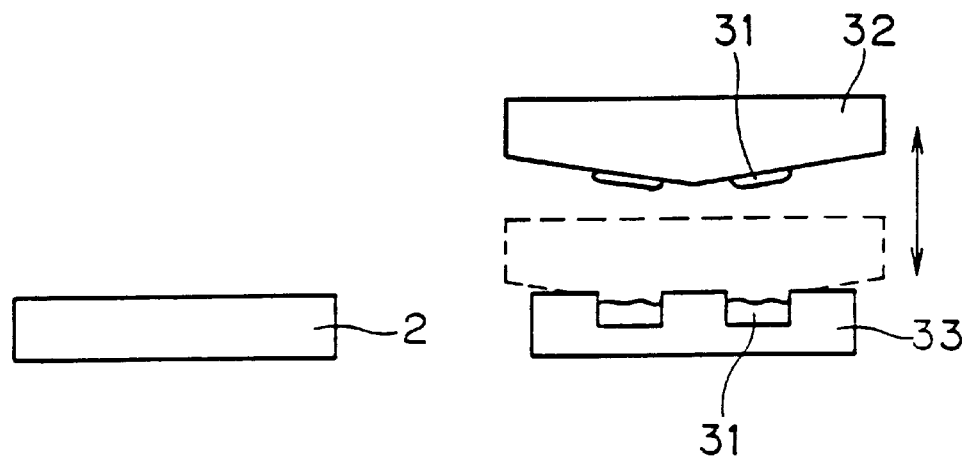
FIGS. 11A and 11B are explanatory diagrams of the principles of pad printing which is performed to manufacture a thin solar battery according to a seventh preferred embodiment of the present invention.
Figure 11B:
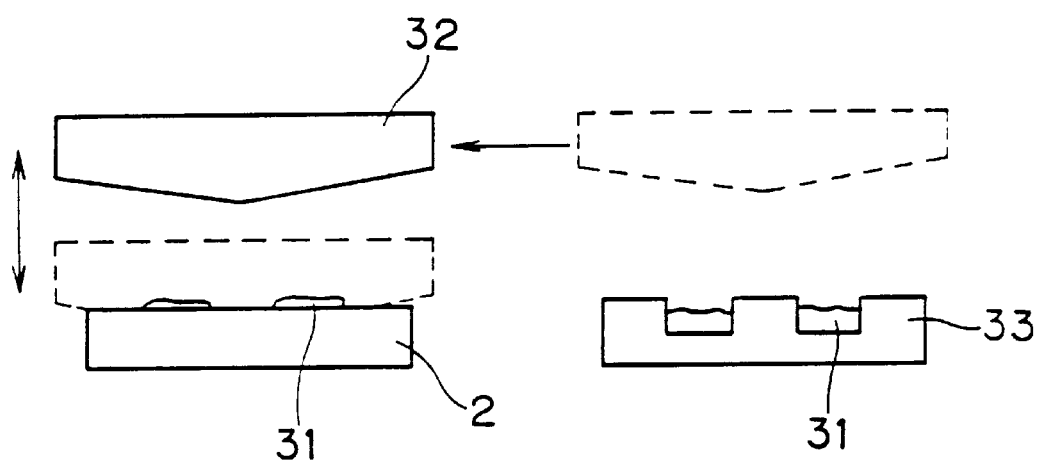
Figure 12A:
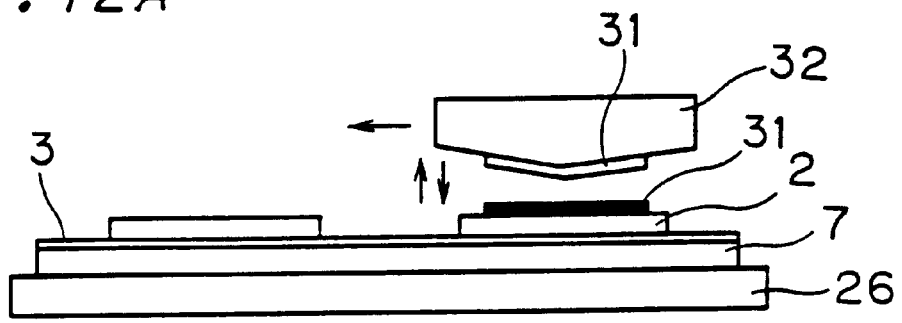
FIGS. 12A and 12B are views describing a process of forming an electrode by pad printing during manufacturing of the thin solar battery according to the seventh preferred embodiment of the present invention.
Figure 12B:
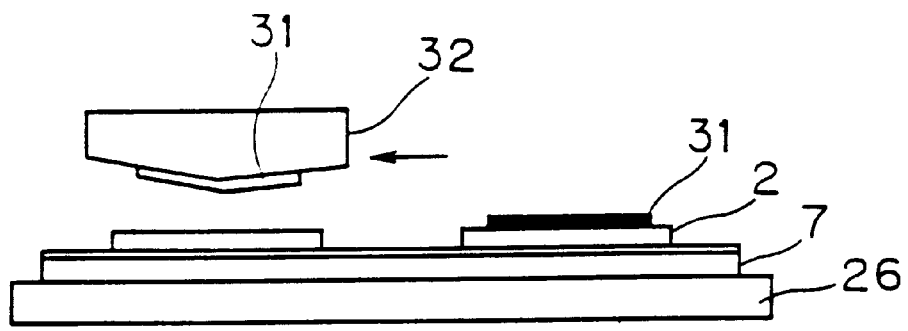

Now, a seventh preferred embodiment of the present invention will be described with reference to associated drawings. FIGS. 11A and 11B are views showing principles of pad printing while FIGS. 12A and 12B are showing a process of forming electrodes on the semiconductor films 2 such as Si films, which corresponds to the step SD of FIG. 1 and FIG. 2D. The explanatory diagrams in FIGS. 12A and 12B show an electrode formation process utilizing pad printing. In FIGS. 11A and 11B and FIGS. 12A and 12B, a rubber pad 32 is pushed against a gravure mask 33 which has a desired pattern to transfer the printing paste 31 which is disposed in an engraving of the gravure mask 33 onto an edge of the pad 32 (FIG. 11A). The pad 32 is then moved above one of the semiconductor films 2 and pressed against this the semiconductor film 2, thereby transferring the pattern of the paste onto the semiconductor film 2 (FIG. 11B).

Next, a description will be given on a method of printing electrodes to all semiconductor films within the module according to the processing sequence described above. As shown in FIG. 12A, the stage 26 seating the glass substrate 7 to which the semiconductor films 2 are adhered is moved so that the pad 32 is aligned to a desired position above one of the semiconductor films 2. As described earlier, the stage needs be accurately stopped with an accuracy preferably within ±0.1 mm. Next, the pattern of the printing paste which formed on the pad 32 is aligned to the semiconductor film 2, and the pad 32 is moved toward the surface of the semiconductor film 2 to transfer the pattern of the printing paste 31 which formed on the surface of the pad 32. Following this, as shown in FIG. 12B, the stage 26 is moved to place the pad 32 above the next semiconductor film 2. This is repeated to accurately form the electrode pattern on every one of the semiconductor films 2 which are arranged within the solar battery module. Transfer of the printing paste from the gravure mask 33 as that shown in FIG. 11A is performed whenever necessary.

Eighth Preferred Embodiment

Figure 13A:
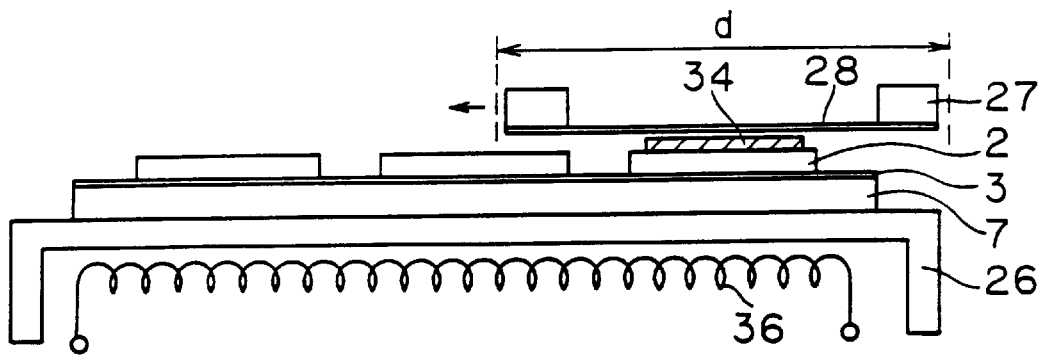
FIGS. 13A to 13C are views describing a manufacturing method of a thin solar battery according to an eighth preferred embodiment of the present invention, particularly describing a process of drying a printed paste.
Figure 13B:
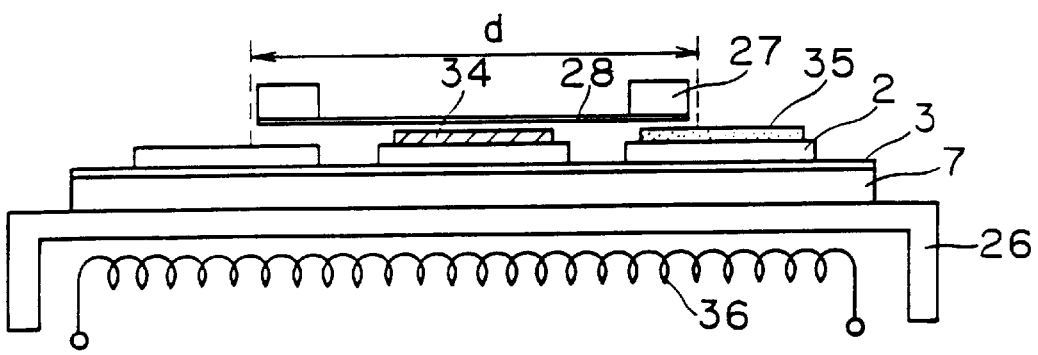
Figure 13C:
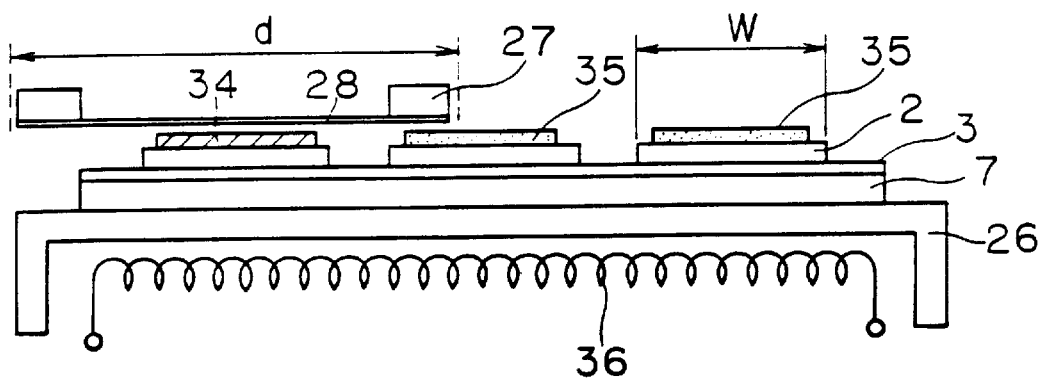

Now, an eighth preferred embodiment of the present invention will be described with reference to associated drawings. FIGS. 13A to 13C are views describing a manner in which a printed paste is dried by a heater which is mounted to a stage. As shown in FIGS. 13A to 13C, a paste 34 immediately after printed on a semiconductor film 2 such as an Si film is dried by a heater 36 which is disposed within the stage 26 so that a hard printing paste 35 is obtained. In FIGS. 13A to 13C, denoted at d is the width of a printing mask while denoted at w is the size of each semiconductor film 2 (e.g., the diameter of a circle, a side of a rectangle).

A description will be continued along the processing sequence described above. As shown in FIG. 13A, the printing paste 34 on the semiconductor film 2 is heated together with the semiconductor film 2 through the glass substrate 7 by the heater 36 which is incorporated in the stage 26. Next, as shown in FIG. 13B, the printing mask frame 27 is moved to a position above one of the semiconductor films 2 which is adjacent to the semiconductor film 2 which already has an electrode, and an electrode is printed on this new semiconductor film 2. During this process shown in FIG. 13B, that is, during printing onto the next semiconductor film 2, the printing paste printed on the previous semiconductor film 2 is dried and hardened. Following this, as shown in FIG. 13C, the sequence proceeds to printing onto a further semiconductor film 2. By repeating printing and drying in this manner, printing onto every semiconductor film 2 within the module is accomplished, completing formation of the electrodes.

As described above, immediately after printed, the printing pastes 34 on the semiconductor films 2 are dried and hardened by heat from the heater 26 of the stage 26 utilizing a transport time as well of the printing mask frame 27. Hence, as compared with a conventional drying step in which all pastes are dried at the same time after printing of the pastes, printing of the electrodes requires a shorter time.

As shown in FIGS. 13A to 13C, to enhance the accuracy of the configuration of the pattern within the printing mask and the accuracy of the printing position, the width of the printing mask frame 27 used in screen printing is set sufficiently wider than the width w of each semiconductor film 2. Hence, while the sequence proceeds from the step of FIG. 13A to the step of FIG. 13B, i.e., while a paste is printed onto an adjacent semiconductor film, there is a possibility that a paste previously printed and not yet completely dry will adhere to the printing mask frame 27 to thereby deteriorate the pattern and a further possibility that the paste adhered to the printing mask frame 27 will subsequently adhere to other semiconductor film 2 or a paste printed on that semiconductor film 2 to thereby destroy the pattern configuration. This problem however is solved in a preferred embodiment described directly below. Although the foregoing has described electrode formation using screen printing, printing by pad printing and drying may be repeated. Pad printing sees less chance of pattern deterioration due to adhesion of a printing paste.

Ninth Preferred Embodiment

Figure 14A:
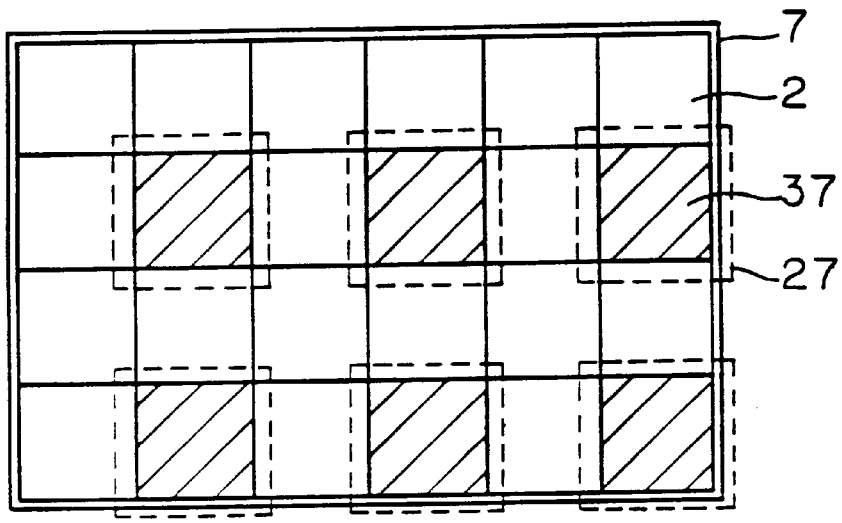
FIGS. 14A and 14B are views showing a glass substrate seating a plurality of solar batteries as viewed from above, describing a manufacturing method of a thin solar battery according to a ninth preferred embodiment of the present invention.
Figure 14B:
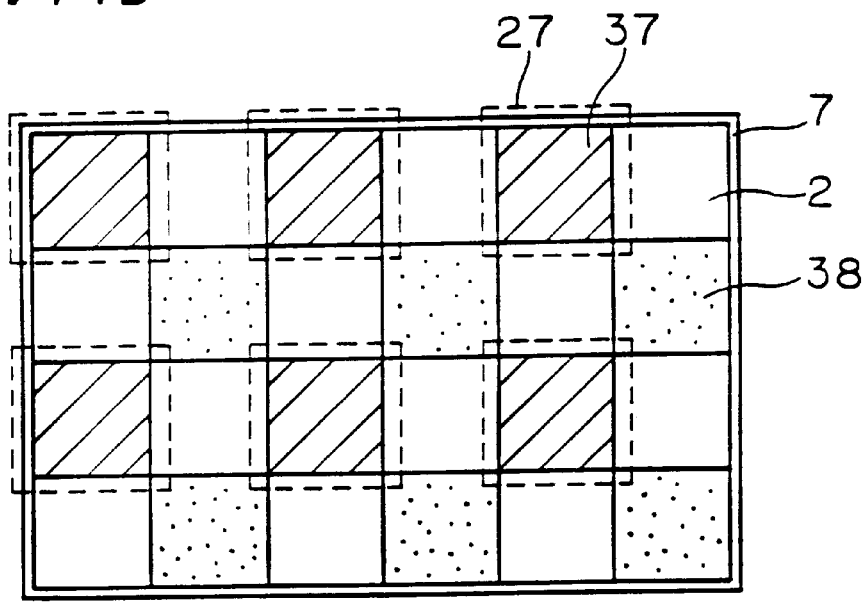

Now, a ninth preferred embodiment of the present invention will be described with reference to associated drawings. FIGS. 14A and 14B show the glass substrate 7 mounted on the stage 26 (not shown) as viewed from above, with a plurality of the semiconductor films 2 such as Si films disposed on top for modularizing. The illustrated example arranges four semiconductor films 2 in a horizontal direction and six semiconductor films 2 in a vertical direction. As shown in FIG. 14A, the printing pastes 34 are printed while skipping an immediately adjacent semiconductor film 2 such that the positions of the printing mask frame 27 during successive printing do not overlap each other. After a printed paste becomes dry and hardened, the printing pastes 34 are printed on non-adjacent skipped semiconductor films 2 in such a manner that the positions of the printing mask frame 27 during successive printing do not overlap each other as shown in FIG. 14B. In this example the printing/drying process is repeated four times in total, thereby completing printing of the electrodes on all semiconductor films 2 which are arranged on the glass substrate 7.

As described above, printing onto adjacent semiconductor films 2 during the same printing process is avoided. Rather, printing is performed in such a manner that the positions of the printing mask frame 27 during successive printing for printing the electrodes on the semiconductor films 2 do not overlap each other, and printing and drying are repeated. Hence, the problem of damaging printed patterns is eliminated. Further, since a reasonably good number of printed patterns are dried at a time, a time necessary for formation of the electrode is reduced. It is needless to mention that use of the heater 34 incorporated in the stage 26 used in the eighth preferred embodiment realizes an even better efficiency.

Figure 15A:
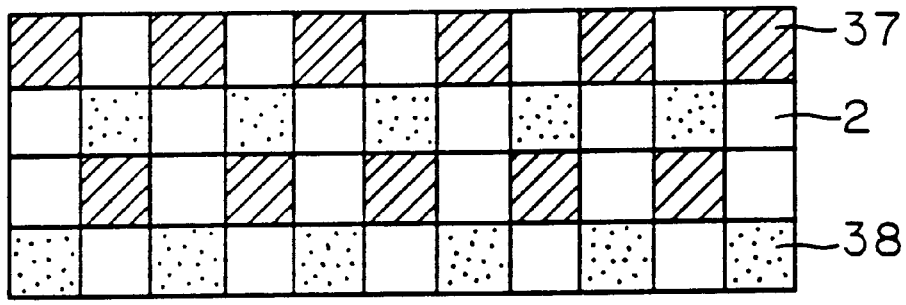
FIGS. 15A to 15C are another views showing a glass substrate seating a plurality of solar batteries as viewed from above, describing a manufacturing method of a thin solar battery according to the ninth preferred embodiment of the present invention.
Figure 15B:
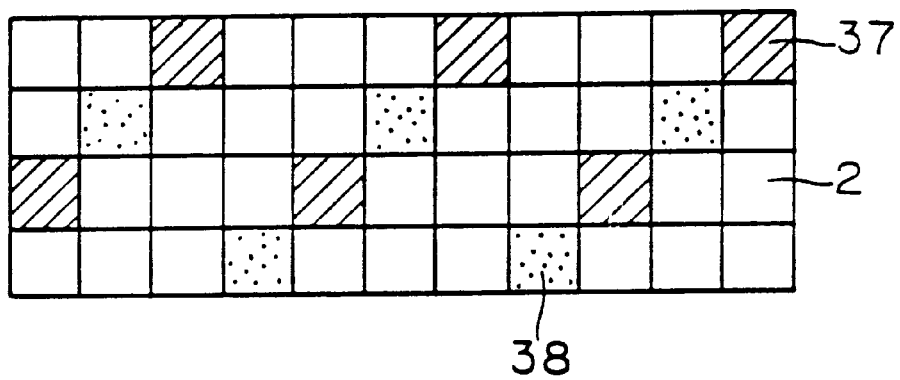
Figure 15C:
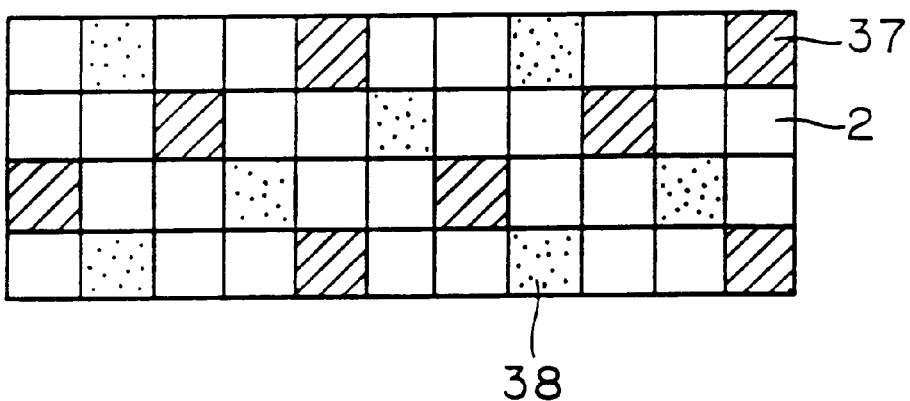

When the printing mask frame 27 has a larger width d than in FIGS. 14A and 14B, semiconductor films 2 to be printed during one printing process need be dispersed with a larger distance from each other as shown in FIGS. 15A to 15C which show an example of an arrangement of the semiconductor films 2 which can be printed during one printing process.

Tenth Preferred Embodiment

Figure 16:
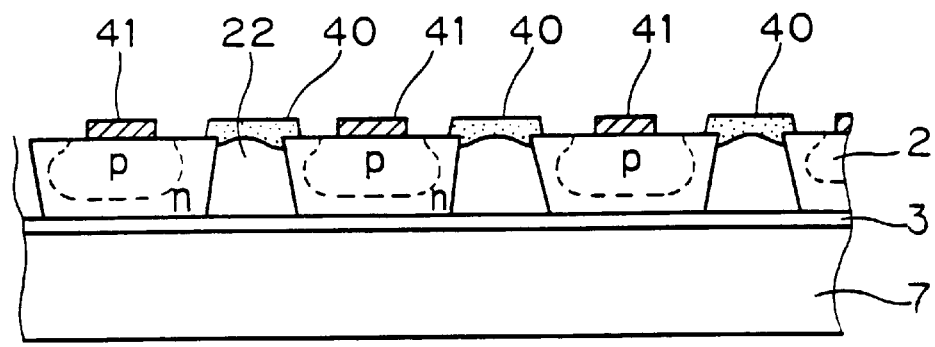
FIG. 16 is a cross sectional view of a solar battery comprising electrodes, describing a manufacturing method of a thin solar battery according to a tenth preferred embodiment of the present invention.
Figure 17:
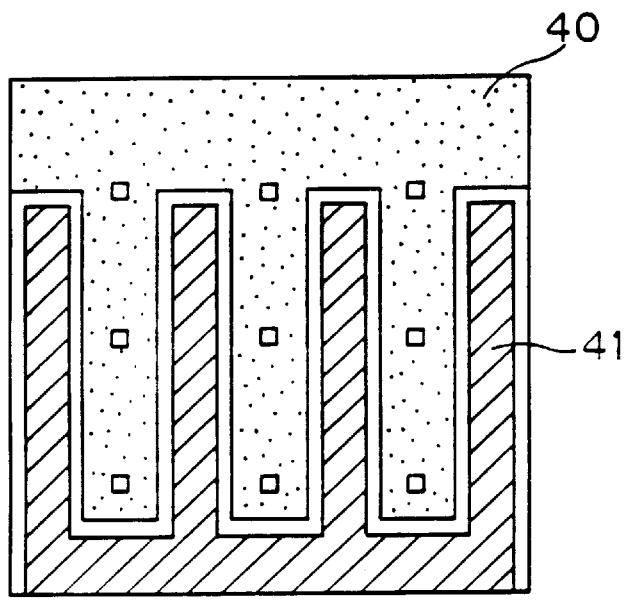
FIG. 17 is a view showing a solar battery comprising electrodes, describing the manufacturing method of a thin solar battery according to the tenth preferred embodiment of the present invention.
Figure 18:
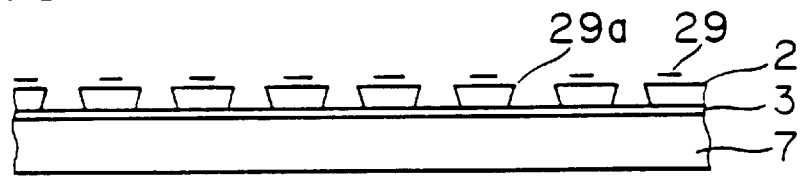
FIG. 18 is a cross sectional view of a solar battery as it is with a mask disposed during printing of electrodes, describing the manufacturing method of a thin solar battery according to the tenth preferred embodiment of the present invention.
Figure 19A:
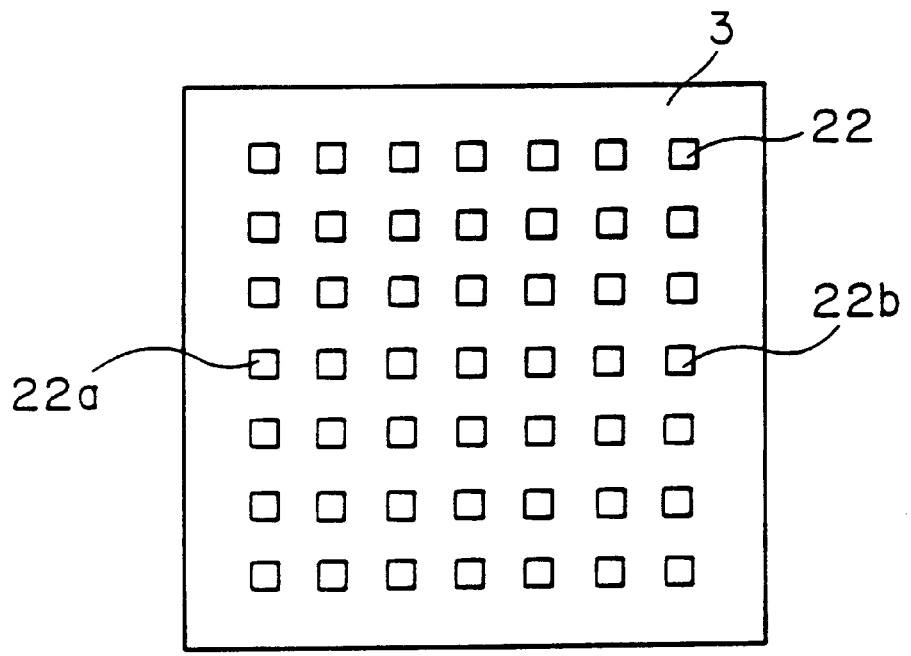
FIGS. 19A and 19B are views of a semiconductor film and a printing mask which are used during manufacturing of a thin solar battery according to the tenth preferred embodiment of the present invention.
Figure 19B:
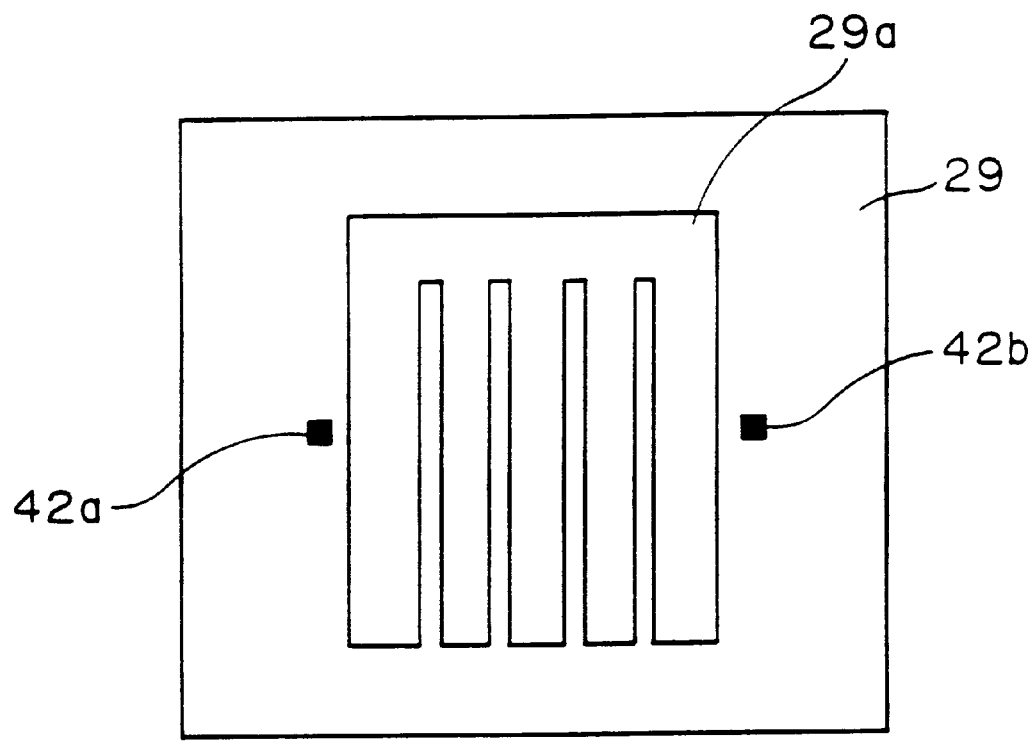
Figure 20:
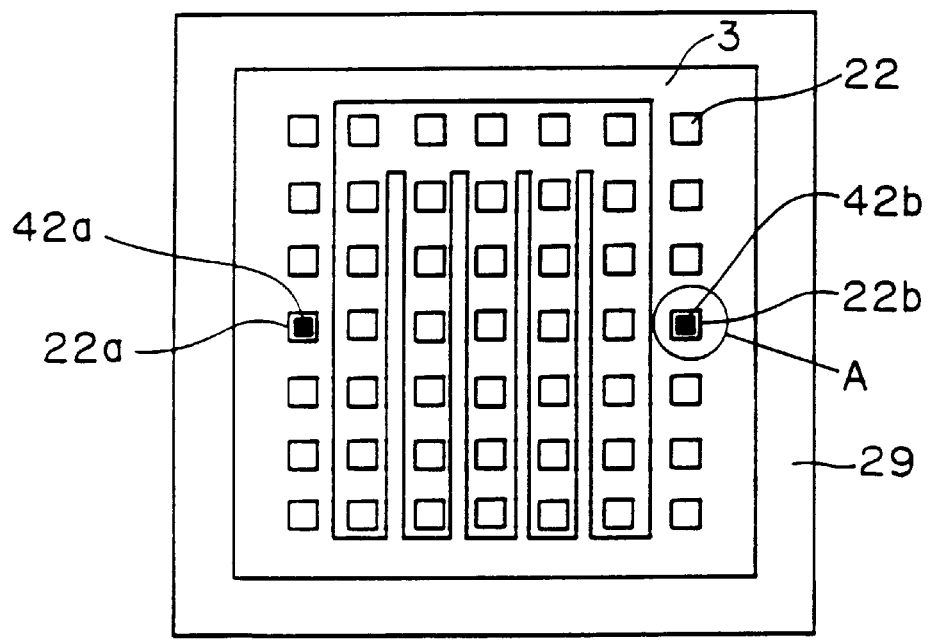
FIG. 20 is a view describing the manufacturing method of a thin solar battery according to the tenth preferred embodiment of the present invention, showing a state where the semiconductor film and the printing mask are placed one atop the other.

Now, a tenth preferred embodiment of the present invention will be described with reference to associated drawings. FIG. 16 is a cross sectional view of a solar battery comprising electrodes. In FIG. 16, first electrode 40 are each formed in an n-type portion of each semiconductor film 2 such as an Si film, for example. The first electrodes are each formed across and around each through hole 22 which is formed in each semiconductor film, while second electrodes 41 are each formed in a p-type portion of each semiconductor film 2. FIG. 17 shows the solar battery with the electrodes of FIG. 16 disposed as viewed from above. In FIG. 17, the first electrodes 40 and the second electrodes 41 are in an interleaving pattern. FIG. 18 is a cross sectional view of the solar battery, showing an arrangement of the mask 29 during formation of the first electrodes. Each opening 29a of the mask 29 is aligned to the through hole of each semiconductor film 2. The printing paste (not shown) is allowed through these openings 29a of the mask to form the first electrodes 40 in the through holes of the semiconductor films 2. FIGS. 19A and 19B are a view of the semiconductor films 2 and a view of the mask, respectively, during formation of the first electrodes 40 using the arrangement of FIG. 18. In FIGS. 19A and 19B, the mask 29 includes alignment markers 42 (42a, 42b) each of a predetermined size and configuration and is placed above the semiconductor films 2 so that the alignment markers 42 (42a, 42b) are aligned to the through holes 22 (22a, 22b) in the manner as that shown in FIG. 18. FIG. 20 shows the mask 29 of FIG. 19B and the semiconductor films 2 of FIG. 19A aligned to each other as they are viewed from above. When printing is performed in this state, an electrode pattern defined by the first electrodes 40 as that shown in FIG. 17 is created, for example. That is, by printing with a few specific through holes 22 (22a, 22b) and the alignment markers 42 (42a, 42b) aligned to each other, the electrode pattern is formed accurately. Although no electrode is printed where the alignment markers 42 (42a, 42b) are aligned for convenience of the printing, the alignment markers may be formed in the openings 29a of the mask 29 so as to allow printing. The through holes 22 each have a diameter of 100 μm, for instance, which in turn makes it possible to suppress the positional accuracy during alignment to at least about 10 μm.

Now, a description will be given on various embodiments of unique configurations of the alignment markers 42 (42a, 42b) which are to be aligned to the through holes 22 (22a, 22b) and unique relationship between the alignment markers and the through holes, while referring to associated drawings each enlarging a portion A of FIG. 20. FIGS. 21 to 32 each show the alignment markers 42 as they are aligned to the through holes 22 of each semiconductor film 2 during printing. In FIGS. 21 to 32, denoted at 43 is a portion where the alignment markers 42 and the through holes 22 overlap each other, while denoted at Δx is a displacement between the through holes 22 and the alignment markers 42 from which the printing accuracy is known.

Figure 21:
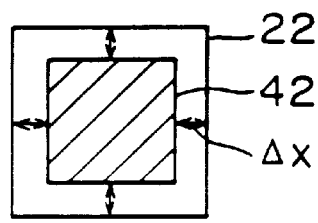
FIG. 21 is a view describing alignment between an alignment marker and a through hole in the tenth preferred embodiment of the present invention.

FIGS. 21 to 26 show alignment between a rectangular through hole 22 and each alignment marker. In FIG. 21, the alignment marker 42 which is a little smaller and shaped in square is aligned to the square through hole 22. To improve the positioning accuracy, the alignment marker 42 is aligned to the through hole 22 in such a manner that the displacements Δx on all four sides of the marker become equal to each other.

Figure 22:
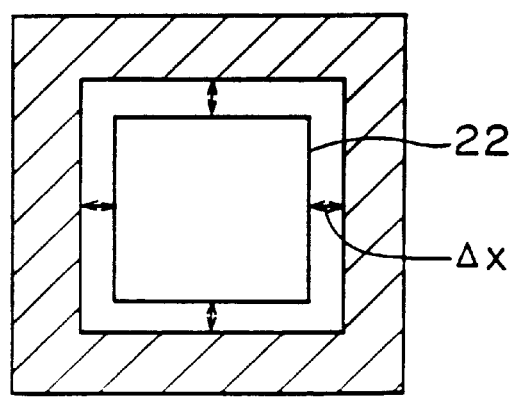
FIGS. 22 to 32 are views describing alignment between various alignment markers and a through hole in the tenth preferred embodiment of the present invention.

FIG. 22 shows alignment between a square through hole 22 and an alignment marker 42 which is formed a little larger than the through hole 22 in the form of a similar square frame which has an opening in the center. As in the case of FIG. 21, to improve the positioning accuracy, the alignment marker 42 is aligned to the through hole 22 in such a manner that the displacements Δx on all four sides of the marker become equal to each other. In FIG. 22, the alignment marker 42 surrounds the through hole 22. Hence, it is possible to confirm the accuracy of alignment after patterning.

Figure 23:
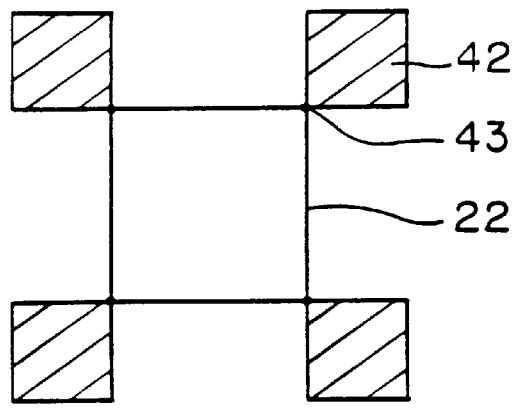

FIG. 23 shows alignment between a rectangular through hole 22 and four alignment markers 42 each positioned to abut each apex 43 of the through hole 22. The four alignment markers 42 are aligned to the four apexes at the same time. Unlike in FIG. 23 which requires four-point-alignment, two alignment markers may be aligned to diagonal two apexes of the through hole 22.

Figure 24:
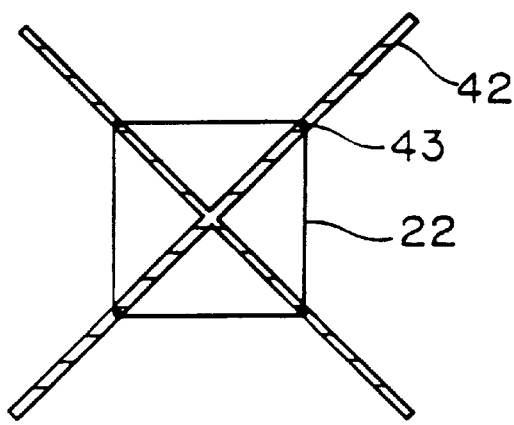

FIG. 24 shows alignment between a rectangular through hole 22 and an alignment marker 42 which is formed in the shape of a cross which has bars passing through the apexes of the through hole 22 (i.e., diagonal lines and extension lines of the same). The alignment marker 42 is aligned to the through hole 22 so as to pass through the apexes of the through hole 22.

Figure 25:
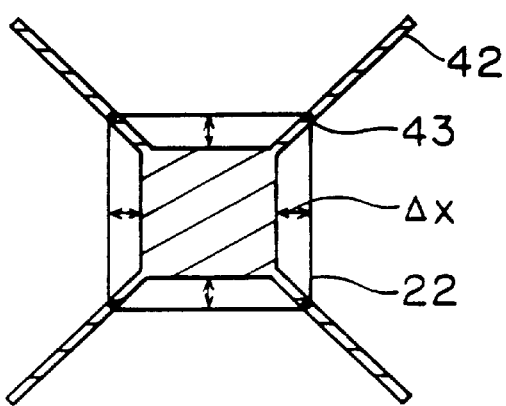

FIG. 25 uses an alignment marker 42 which is obtained by combining the alignment marker of FIGS. 21 and 24. This alignment marker 42 is aligned to the through hole 22 so that the bars of the alignment marker 42 pass through the apexes of the through hole 22 and the displacements Δx on all four sides between the marker 42 and the through hole 22 become equal to each other.

Figure 26:
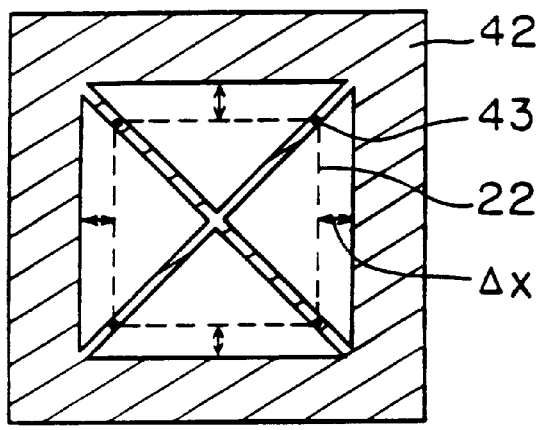

FIG. 26 uses an alignment marker 42 which is obtained by combining the alignment marker of FIGS. 22 and 24. This alignment marker 42 is aligned to the through hole 22 so that the bars of the alignment marker 42 pass through the apexes of the through hole 22 and the displacements Δx on all four sides between the marker 42 and the through hole 22 become equal to each other.

Figure 27:
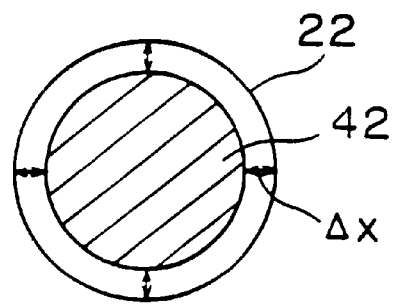
Figure 28:
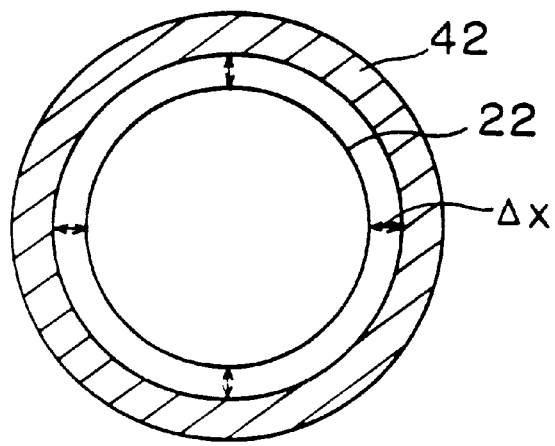

FIGS. 27 to 32 show alignment between the alignment marker 42 and the through hole 22 where the through hole 22 is circular. The alignment marker 42 used in FIG. 27 is formed in the shape of a circle which is smaller than the circular through hole 22, while the alignment marker 42 used in FIG. 28 is formed in the shape of a circle which is larger than the circular through hole 22. The illustrated alignment corresponds to the alignment shown in FIGS. 21 and 22 where the through hole 22 is rectangular. In both cases, the alignment marker 42 is aligned to the through hole 22 so that the displacement Δx stays the same around the periphery of the through hole 22.

Figure 29:
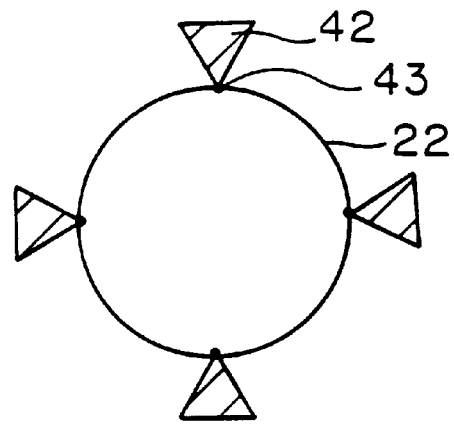

FIG. 29 uses alignment markers 42 which are circumscribed to the circular through hole 22 at four opposed positions. The four alignment markers 42 are aligned to the four points at the same time. At least three alignment markers 42 are necessary.

Figure 30:
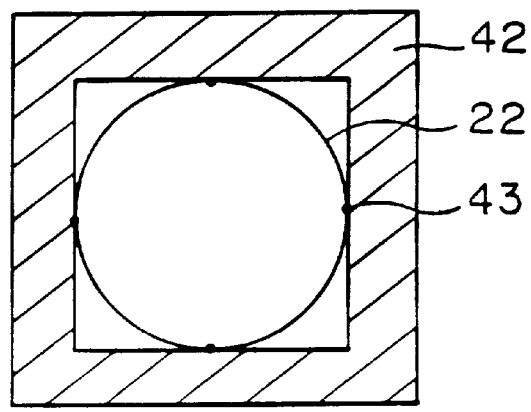

In FIG. 30, an alignment marker 42 which is shaped like a rectangular frame is aligned to the circular through hole 22 so as to be circumscribed to the through hole 22.

Figure 31:
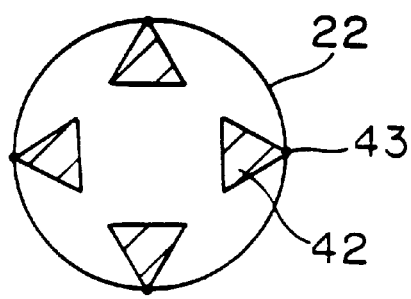

FIG. 31 shows alignment in which the alignment marker 42 of FIG. 29 is positioned inside the through hole 22.

Figure 32:
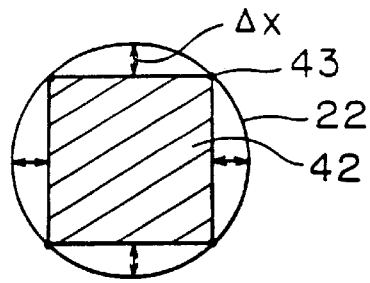

In FIG. 32, a rectangular alignment marker 42 is aligned to the circular through hole 22 so as to be inscribed to the through hole 22.

Among these alignment markers 42, the alignment marker 42 used in FIG. 21, 27, 31 or 32 is located inside the through hole 22 when aligned to the through hole 22. Hence, the alignment marker 42 is erased by a printing paste during printing. In contrast, the other markers 42 stay unerased even after patterning, and therefore, these alignment markers 42 can be used to confirm the alignment accuracy. In particular, the alignment markers 42 of FIGS. 25, 26 and 32 realize a higher alignment accuracy than the other markers 42 since these markers are aligned at the points while adjusting the displacement Δx equal.

Eleventh Preferred Embodiment

Figure 33:
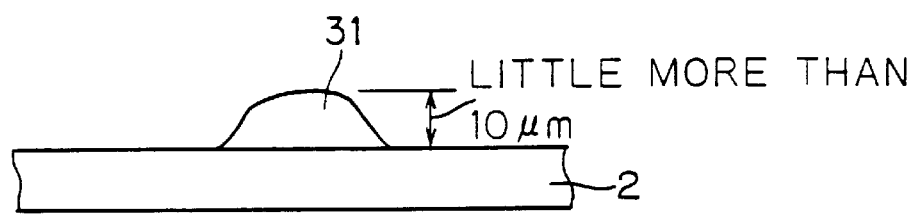
FIGS. 33 and 34 are cross sectional views of an electrode which is formed by screen printing, describing a plating method in an eleventh preferred embodiment of the present invention.
Figure 34:
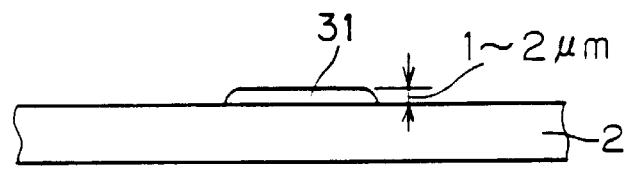

Now, an eleventh preferred embodiment of the present invention will be described with reference to associated drawings. FIGS. 33 and 34 are cross sectional views of electrodes which are formed by screen printing and pad printing, respectively. As shown in FIG. 33, when printed by screen printing, an electrode is a little thicker than 10 μm. On the other hand, the thickness of an electrode is at most 1 to 2 μm when formed by pad printing as shown in FIG. 34 while the thickness needs be at least a little more than 10 μm to reduce the apparent resistance and to route electricity efficiently. To deal with this, an electrode printed by pad printing is plated to supplement the shortage in thickness from a designed thickness.

Figure 35:
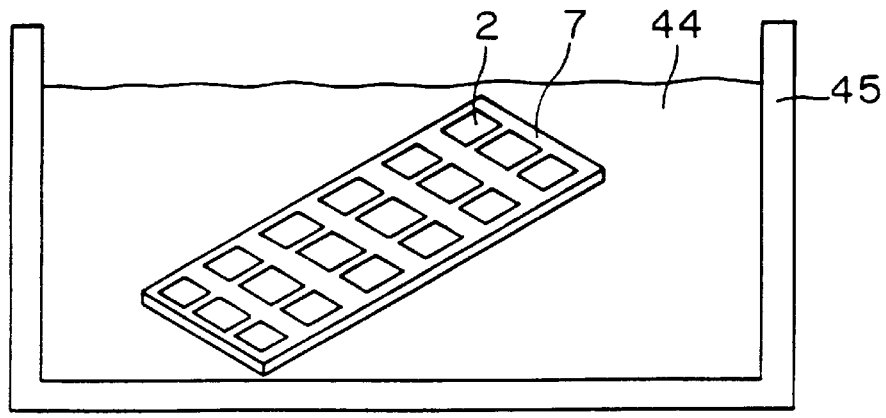
FIG. 35 is a cross sectional view of a plating liquid tank, describing the plating method in the eleventh preferred embodiment of the present invention.
Figure 36:
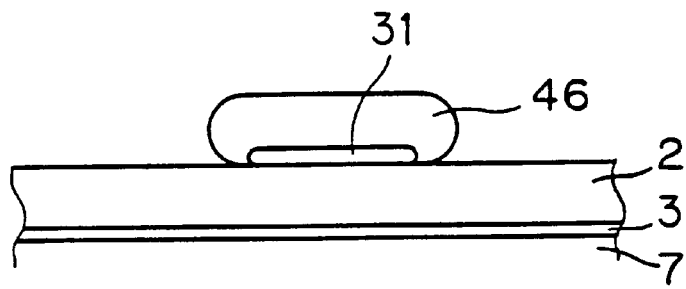
FIG. 36 is a cross sectional view of an electrode as it is after plated in the eleventh preferred embodiment of the present invention.

FIG. 35 is a diagram showing a manner in which electrode portions printed on the surface of the semiconductor film 6 which is adhered on the glass substrate 7 are plated thick, and FIG. 36 is a cross sectional view of an electrode which is formed by printing and subsequent plating. In FIGS. 35 and 36, denoted at 45 is a plating liquid tank filled with plating liquid 44 and denoted at 46 is a plated thick film which is formed on the surface of the printing paste 31. After drying printed printing pastes, the glass substrate 7 is immersed into the plating liquid 44. Electroless plating is performed to form a thick plating film on the printing pastes. For instance, the plating liquid 44 may be (1) silver cyanide, potassium cyanide, a silver plating film using potassium carbonate, (2) potassium gold cyanide, potassium cyanide, potassium carbonate, a silver plating film using potassium diphosphate, (3) copper sulfate, sulfuric acid, a copper plating film using ion chloride, (4) nickel sulfate, nickel chloride, a nickel plating film using boric acid.

Thus, since the thick plating films 45 are formed on the printing pastes 31 by plating, it is possible to form sufficiently thick electrodes even with pad printing which does not produce a sufficiently thick electrode. Hence, only if the basis of electrodes is formed at a high accuracy and a high through put as typically possible in pad printing, electrodes are eventually formed accurately at a high through put. Further, plating may be performed when electrodes formed by screen printing are not sufficiently thick.

Twelfth Preferred Embodiment

Figure 37:
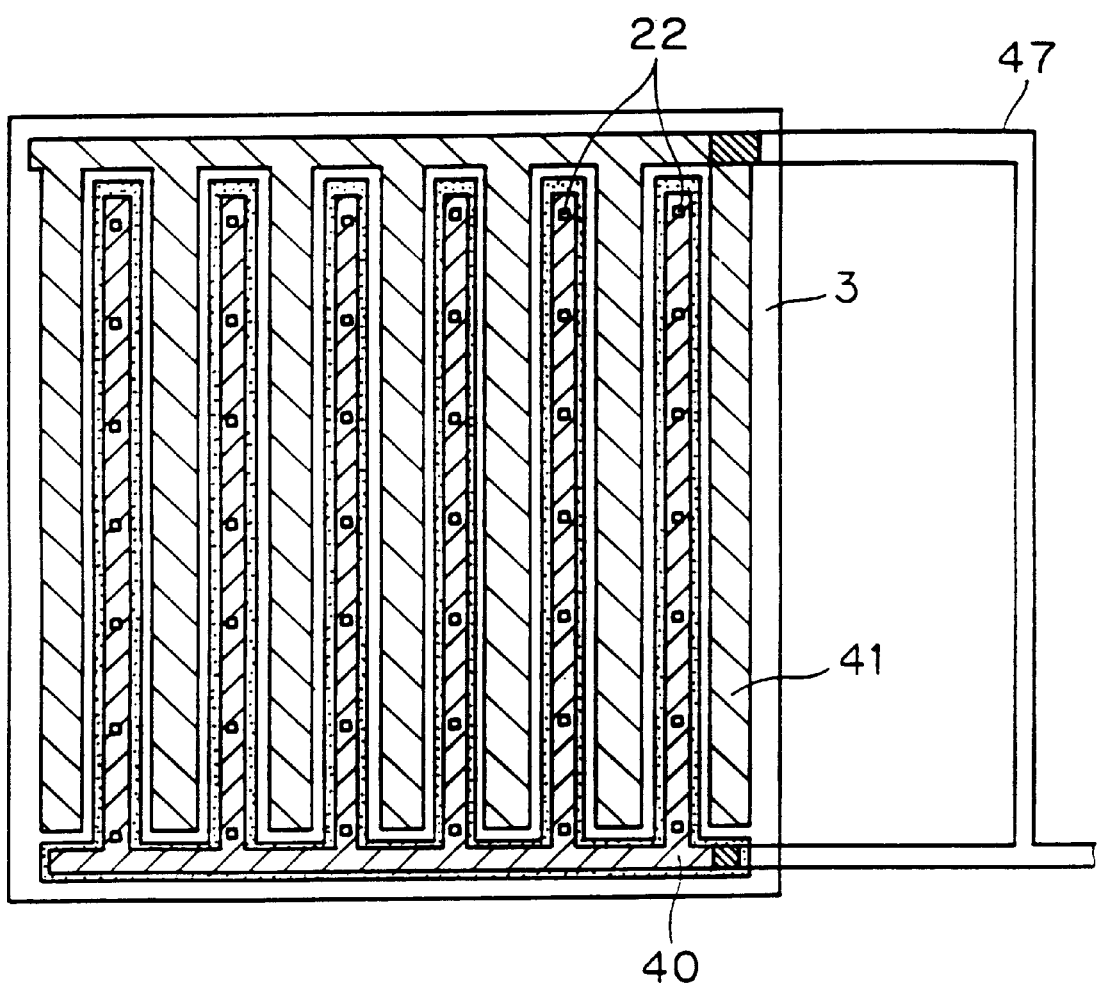
FIG. 37 shows an electrode pattern of a solar battery according to a twelfth preferred embodiment of the present invention.
Figure 38:
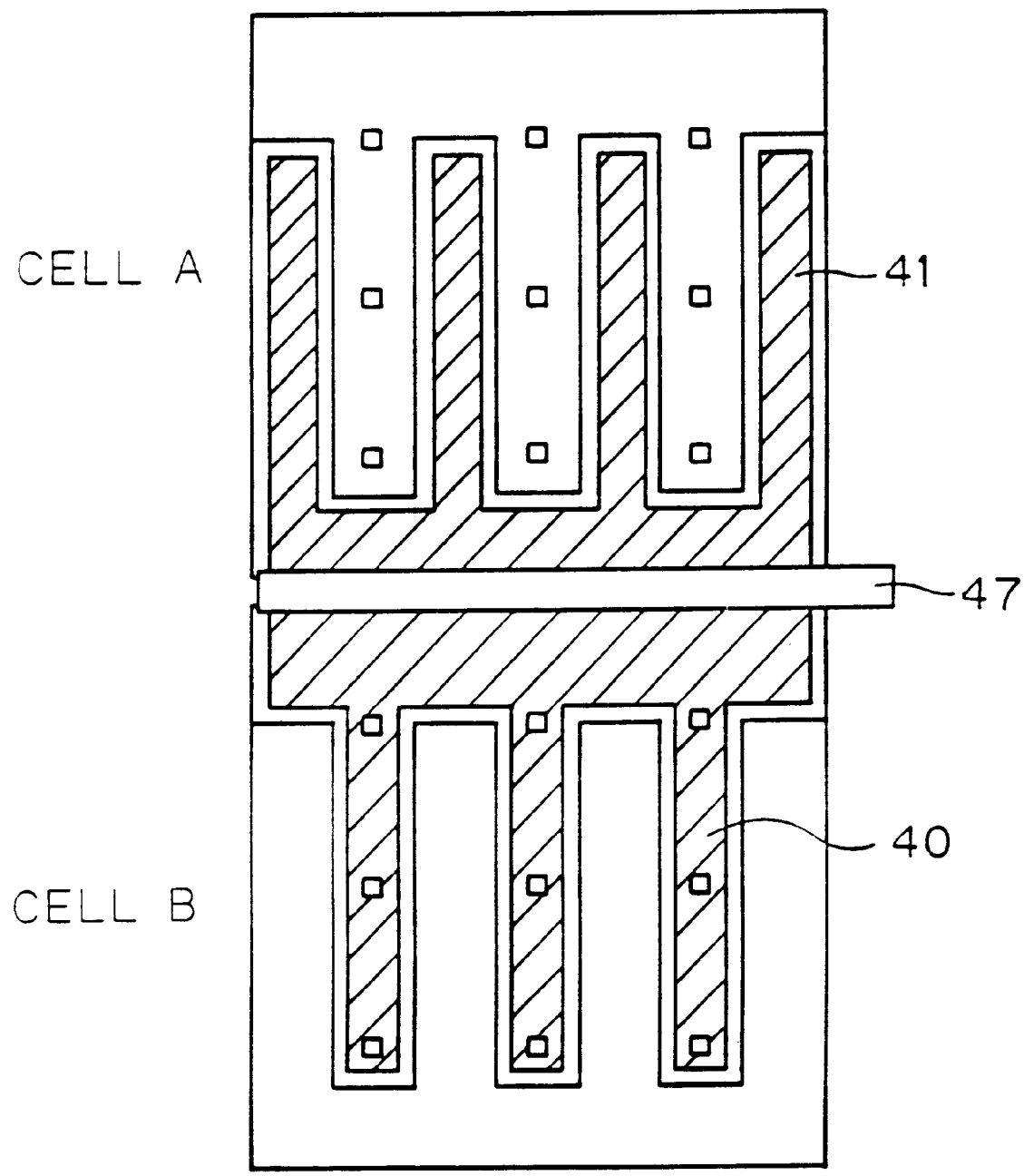
FIG. 38 is a view describing a process of forming a tab electrode for connection of adjacent solar battery cells to each other in the twelfth preferred embodiment of the present invention.
Figure 40A:
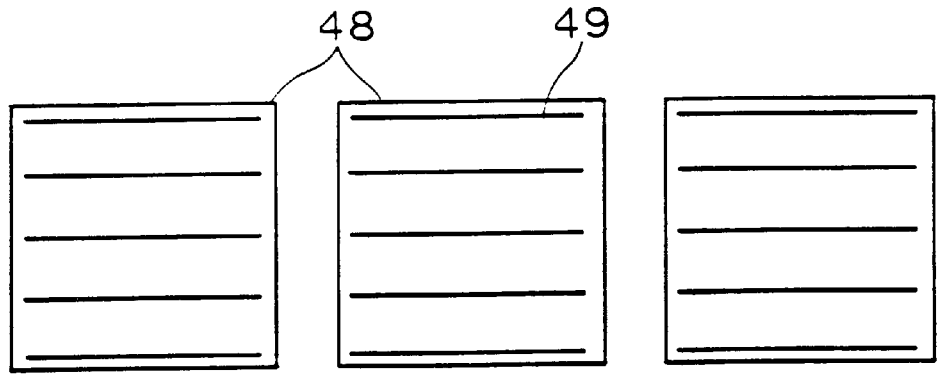
FIGS. 40A and 40B are views showing, connection of a plurality of solar battery cells using a monolithic tab in the twelfth preferred embodiment of the present invention.
Figure 40B:
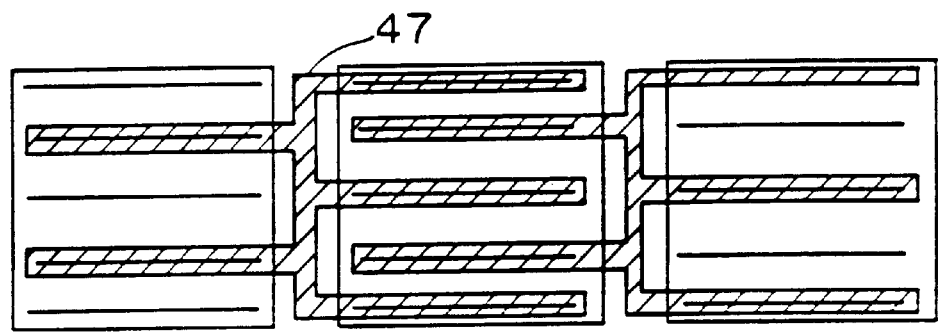

Now, a twelfth preferred embodiment of the present invention will be described with reference to associated drawings. FIG. 37 is a conceptual diagram showing an electrode pattern of a solar battery, describing a process of forming tab electrodes. In FIG. 37, it is necessary to connect the first electrodes 40 (for n-type) to the second electrodes 41 (for p-type) to make electricity which is generated in the power generation layer available outside the solar battery. Hence, as shown in FIG. 37, a tab 47 needs be formed. FIG. 38 is a conceptual diagram showing a case where adjacent cells are connected to each other. In the illustrated example, the second electrode 41 (for p-type) of a cell A is connected to the first electrode 40 (for n-type) of a cell B. FIG. 39 shows an electrode pattern of one actual solar battery cell. The white linear pattern forms the first electrodes 40 (for n-type) and the second electrode 41 (for p-type) for each column. To form the tabs 47 to this white linear pattern, five tabs are necessary in FIG. 39. In FIG. 39, arrows pointing the right indicate a tab formation position 49. FIGS. 40A and 40B are conceptual diagrams showing connection using tabs of a plurality of solar battery cells which are arranged.

Next, a method of forming tabs (tab electrode formation process) will be described. First, a solder is printed at the tab formation position 49 as shown in FIG. 40A. The method of printing a solder is the same as the printing method already described. Tabs are arranged on solders. As shown in FIG. 40B, a monolithic tab may be used for better efficiency. A tab preferably includes an extra area (play) considering heat history during the tab formation process. In general, a tab is formed by plating a solder on a copper plate. However, when a monolithic tab is to be used, a copper plate may be punched through into a desired configuration by pressing and may be thereafter plated.

Figure 41:
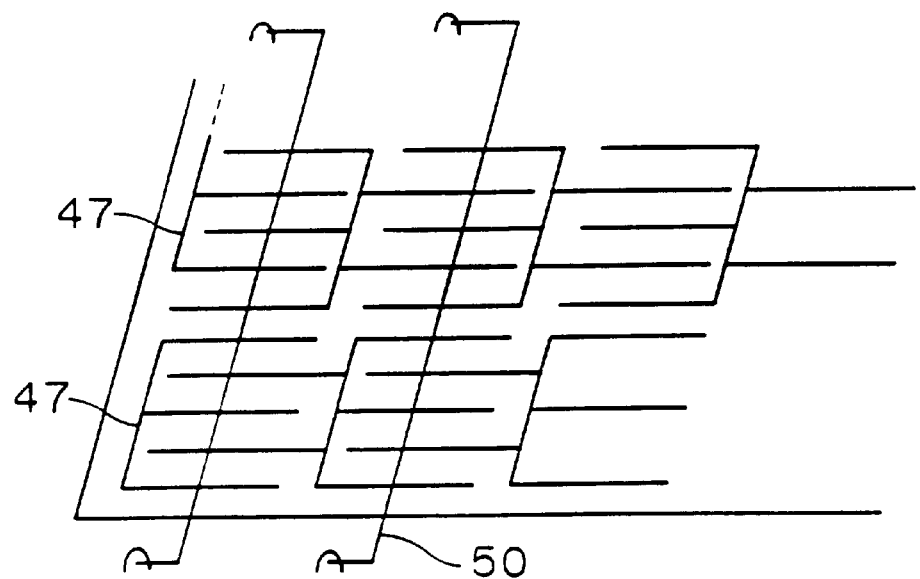
FIG. 41 is a view showing a part of a tab formation process in the twelfth preferred embodiment of the present invention.

FIG. 41 is a view showing a part of the tab formation process. A monolithic tab is placed at a soldering portion using a robot or the like and temporarily fixed using a tab pressor 50. The substrate is heated to 180° C. to melt the solder and then cooled, which completes the tab formation process. After the tab formation process, the transparent sheet 8 and the tetrafilm 75 in which an aluminum foil is sandwiched by a fluoride vinyl film are placed on both the light receiving surface and the opposite surface, and the structure is heated to about 150° C. in a bonding apparatus for deaeration between the modularizing glass 7 and the tetrafilm 75. Further, end surfaces of the structure are covered with an aluminum frame and a leading output terminal 77 is attached to the structure using a silicon resin, whereby a solar battery module seating a plurality of solar battery cells is completed.

Unlike described above, the semiconductor films 2 may not be mutually connected in the interleaving shape within the module. Rather, the semiconductor films 2 may be connected to each other after connecting a number of the first electrodes 40 (for n-type) or the second electrode 41 (for p-type) in series, or any other connection method may be used.

Thirteenth Preferred Embodiment

Figure 42:
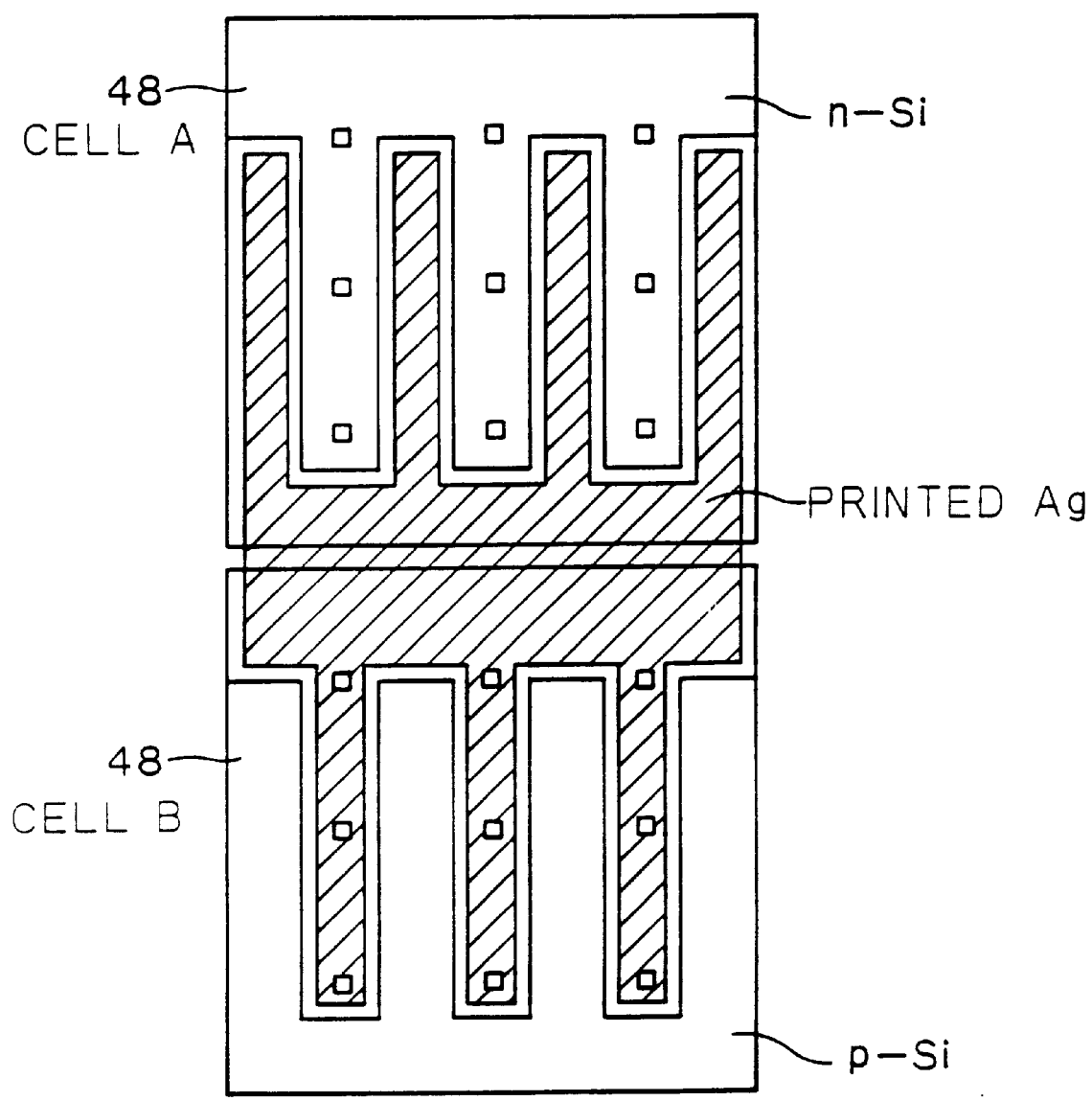
FIG. 42 is a view showing a connection process utilizing printing instead of a tab according to a thirteenth preferred embodiment of the present invention.

Although the twelfth preferred embodiment above uses a monolithic tab, a complex tab formation process is not necessary since the position at which a tab is to be formed is determined in advance, but instead a wire line which corresponds to a tab may be printed at the position at which a monolithic tab is to be formed, rather than printing a solder at the tab formation position 49 as shown in FIG. 40A. For instance, a wire line may be printed as indicated by a shadowed portion in FIG. 42. Needless to mention, the efficiency becomes even better if a wire line is printed at the same when the first electrodes 40 (for n-type) or the second electrode 41 (for p-type) are printed.

Fourteenth Preferred Embodiment

Figure 43A:
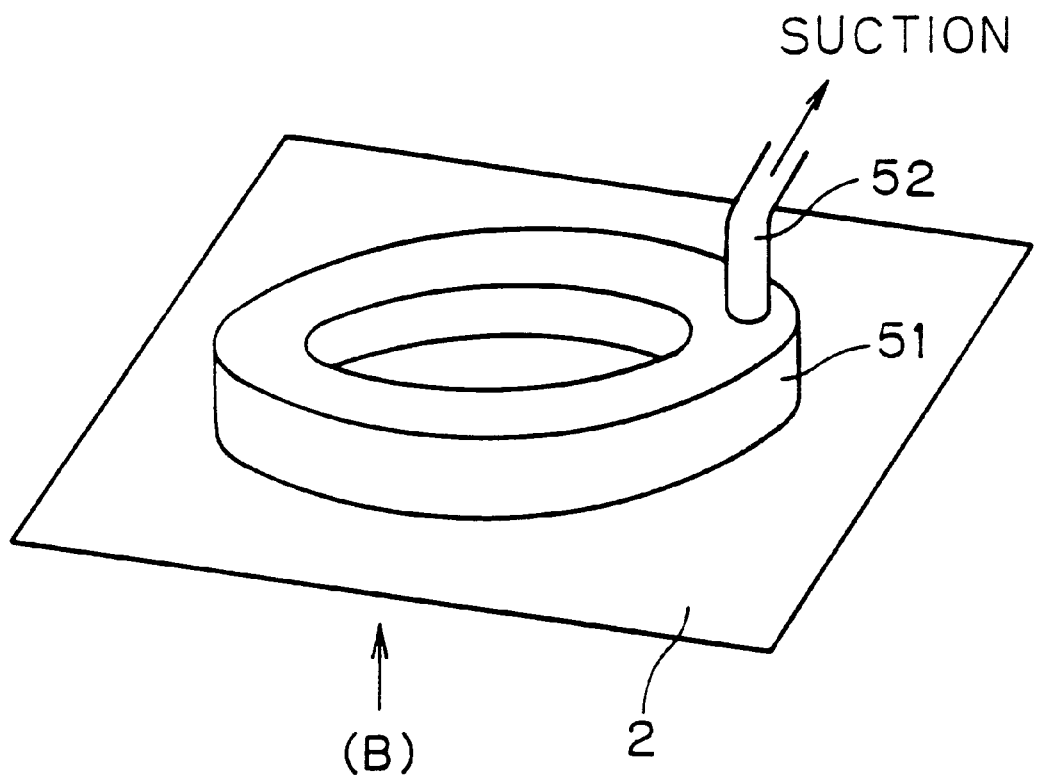
FIGS. 43A and 43B are views showing a structure of a semiconductor film suction chip used in a fourteenth preferred embodiment of the present invention.
Figure 43B:
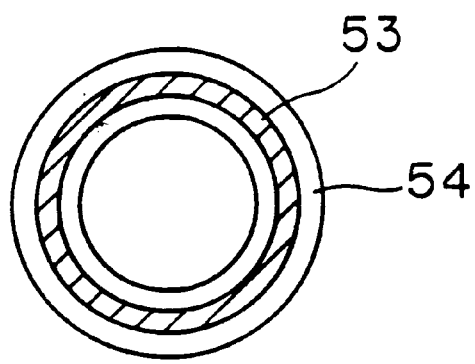

Now, a fourteenth preferred embodiment of the present invention will be described with reference to associated drawings. FIGS. 43A and 43B show a structure of a suction chip for handling a semiconductor film less than 100 μm in thickness. FIG. 43B in particular is a view of a structure of the suction chip as viewed from below (from a direction (B)). In FIGS. 43A and 43B, denoted at 51 is the suction chip which has a suction shaft 52, i.e., a pipe through which suction force is applied by pumping or the like. The semiconductor films 2 are sucked onto a groove 53 which is formed in a ring-like suction surface 54 of the suction chip 51, and the semiconductor films 2 are handled as such. To utilize suction force from the suction chip, the ring-like portion of the suction chip is preferably as close as possible to and a little smaller than the inscribed circle of each semiconductor film 2.

Next, a behavior of the suction chip in this embodiment will be described. As the suction chip 51 is moved closer to the semiconductor film 2 which measures 10 cm along each side and is not thicker than 100 μm in such a manner that the suction surface 54 is parallel to the semiconductor film 2 and when a distance between the suction surface 54 and the semiconductor film 2 is reduced to about 1 mm or less, the semiconductor film 2 is sucked onto the suction surface 54 by suction force applied from the groove 53 which extends 2 mm in width on the suction chip 51 which has the ring-like portion of maximum 5 cm in diameter. The suction force is 0.5 kgf/cm². If the width of the groove is 5 mm or smaller, considering the destruction strength of the semiconductor film, to suck the semiconductor film formed by a silicon film, for example the range of the suction force is set 0.05 to 0.5 kgf/cm².

Figure 44:
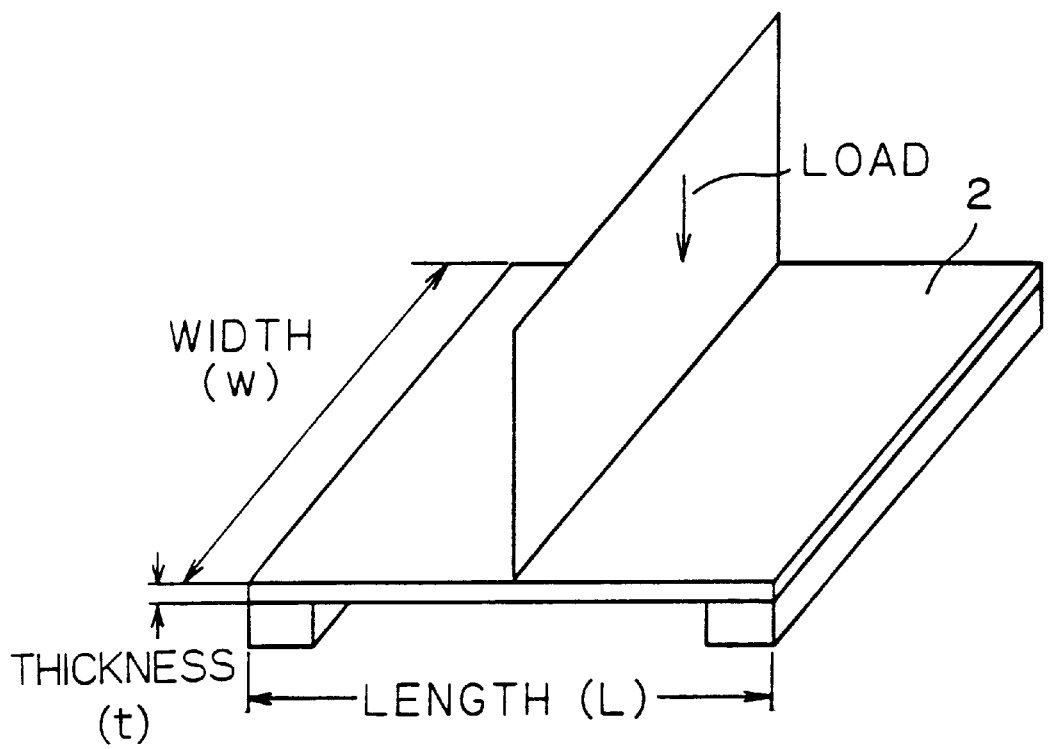
FIG. 44 is an explanatory diagram for describing calculation of a suction pressure of when a suction chip is used in the fourteenth preferred embodiment of the present invention.

The suction force of the suction chip 51 is determined depending on the destruction strength of the semiconductor film as described below. The destruction strength is evaluated by a 3-point bending test as that shown in FIG. 44. In the system of FIG. 44, the destruction load P of a silicon semiconductor film is expressed as:

$$P=2W\epsilon t^2/3L$$

Since the destruction stress of a silicon bulk is $\epsilon=3\times10^9$ dyn/cm$^2$, in the system where L=W holds, $$P=2.04\times10^3 t^2 \text{ kgf}$$

If the thickness t is 100 μm, $$P=0.2 \text{ kgf}$$

Since the destruction stress here is a value for a silicon bulk, the suction force during sucking is about 0.05 to 0.5 kgf.

When the semiconductor films 2 are handled in such an apparatus, the semiconductor films as thin as 100 μm or less are handled without any damage. Even when the semiconductor film is moved upward as sucked to the suction surface and sucking is stopped to drop the semiconductor films from a height of 1 cm onto a hard plane such as a glass plane, the semiconductor film 2 which measures 10 cm along each side and has a thickness ranging from 50 to 100 μm did not break.

Fifteenth Preferred Embodiment

Figure 45:
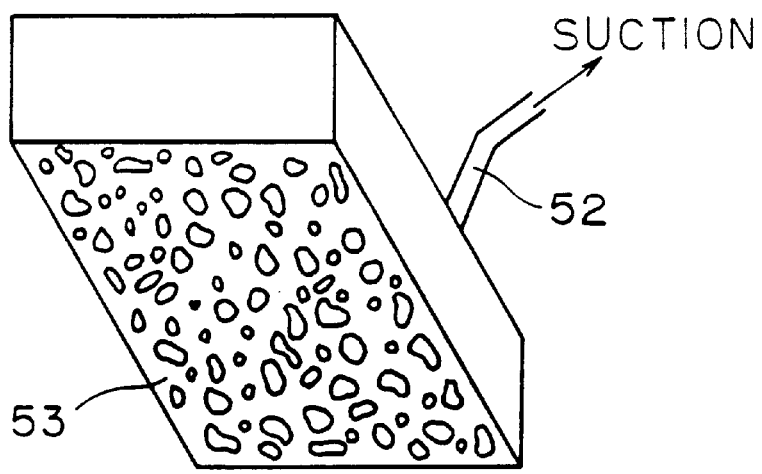
FIG. 45 is a view showing a structure of a semiconductor film suction chip used in a fifteenth preferred embodiment of the present invention.

Although the fourteenth preferred embodiment uses the ring-like suction chip, the suction chip may be made of a perforated material such as a sponge as shown in FIG. 45. A sponge material is preferably a resin fluoride, a vinyl chloride resin or etc. It was confirmed that such a suction chip can suck and hold a silicon semiconductor film which is not thicker than 100 μm with suction force of 0.05 to 0.5 kgw/cm$^2$ as in the fourteenth preferred embodiment.

Sixteenth Preferred Embodiment

Figure 46A:
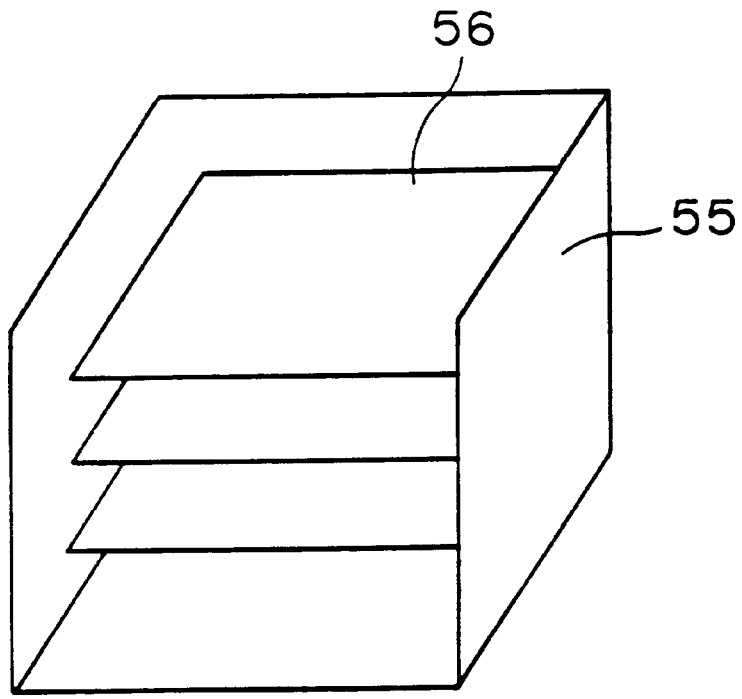
FIGS. 46A and 46B are views showing a structure of a semiconductor film storage cassette used in a sixteenth preferred embodiment of the present invention.
Figure 46B:
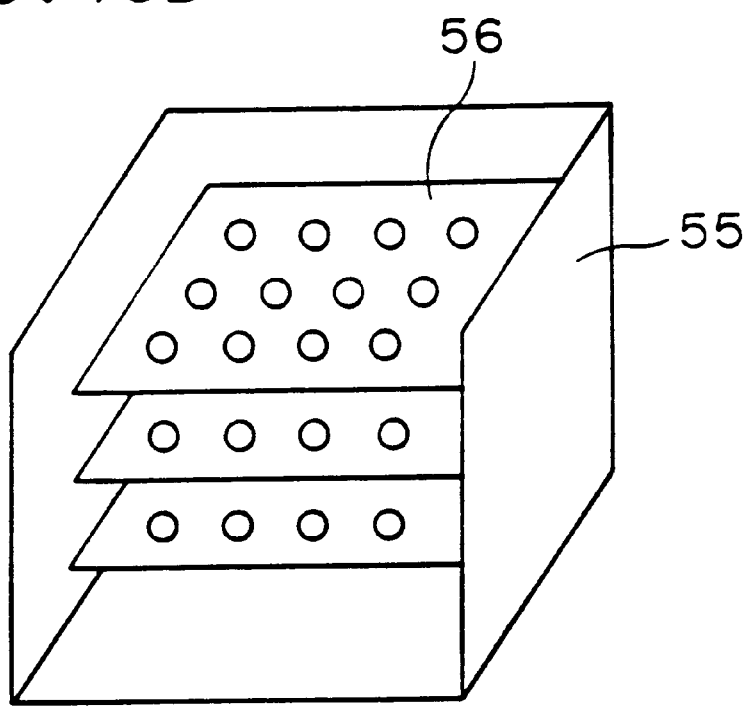

Now, a sixteenth preferred embodiment of the present invention will be described with reference to associated drawings. FIGS. 46A and 46B show a structure of a storage cassette 55 for handling a semiconductor film which is not thicker than 100 μm using the suction chip of the fourteenth or the fifteenth preferred embodiment and for feeding a plurality of such semiconductor films at one time to the next process step. The storage cassette 55 for storing the semiconductor films 2 is similar to a silicon wafer of 4 to 6 inches in diameter. However, since the silicon semiconductor films 2 are each 60 to 100 μm in thickness and measures about 10 cm along each side, the cassette needs be structured to accommodate warping and chipping. In FIGS. 46A and 46B, a partition plate 56 is disposed for each shelves of the storage cassette to deal with warping of the semiconductor films 2. The partition plate 56 may be a punching mesh plate as that shown in FIG. 46B or a net-like mesh plate.

Figure 47:
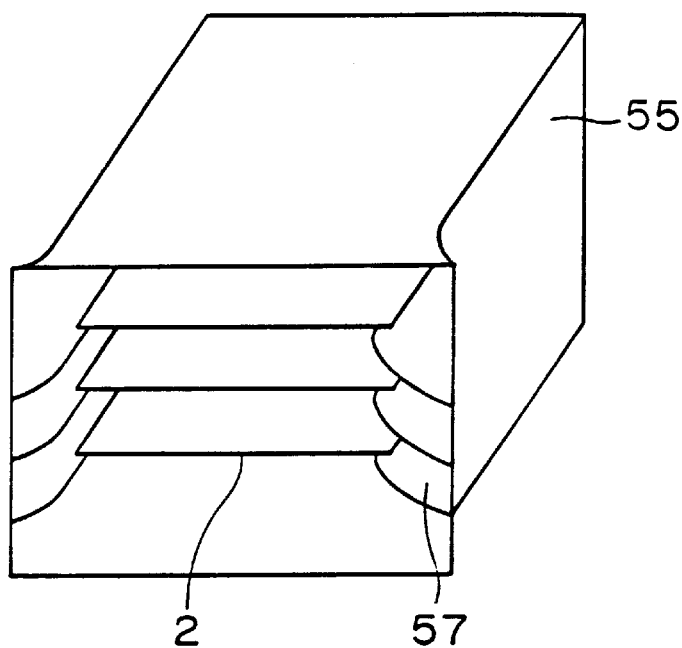
FIG. 47 is a view showing a structure of another semiconductor film storage cassette used in the sixteenth preferred embodiment of the present invention.

FIG. 47 shows another structure of the storage cassette 55. This storage cassette 55 has a wider entrance and an insertion guide 57 at the entrance. Hence, there is no problem of chipping of the semiconductor films 2 when the semiconductor films 2 are inserted into and retrieved from the cassette.

Figure 48:
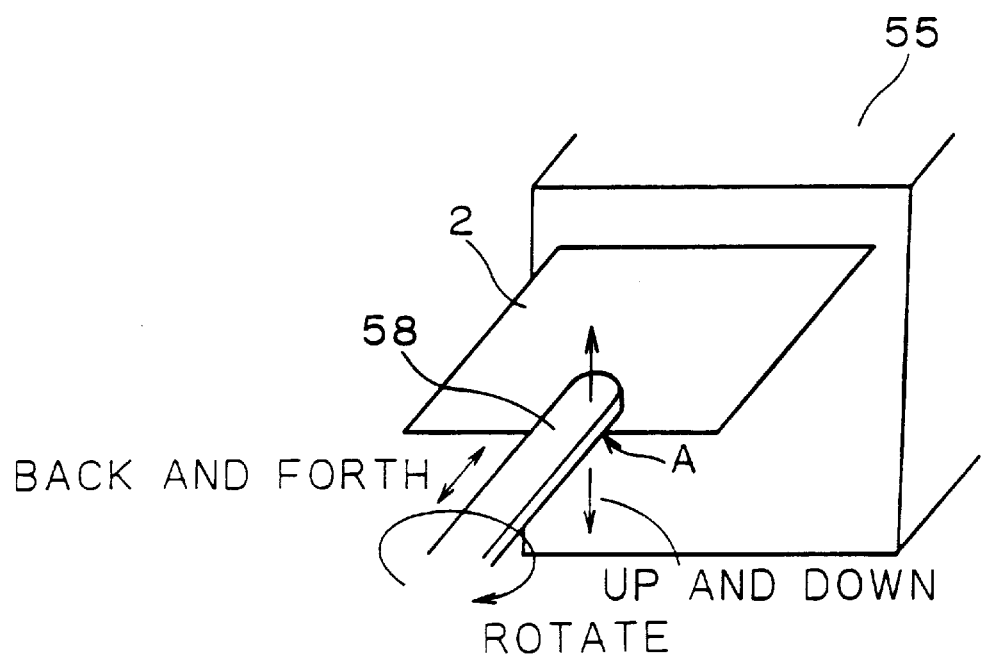
FIG. 48 is a view showing insertion and removal of a semiconductor film into and from the semiconductor film storage cassette in the sixteenth preferred embodiment of the present invention.

Further, FIG. 48 shows a manner in which the semiconductor films 2 are inserted into and retrieved from the storage cassette 55. In FIG. 48, the suction chip 51 (not shown) is positioned on the A side to the robot arm 58, and the robot arm 58 is driven back and forth, up and down, left to right and vice versa, the semiconductor films 2 are handled.

Seventeenth Preferred Embodiment

Figure 49:
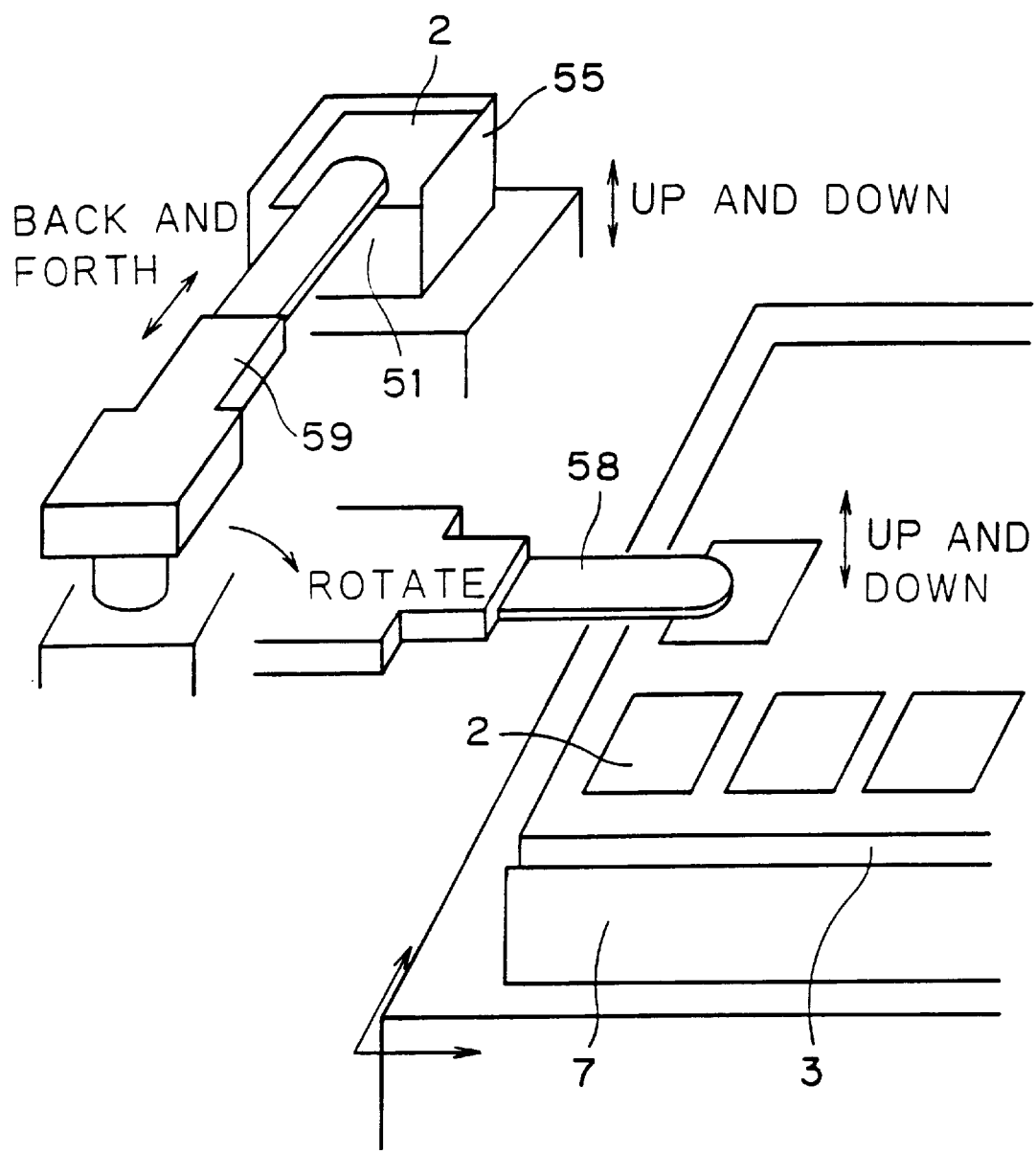
FIG. 49 is a view showing a manner in which a robot arm retrieves a semiconductor film from a semiconductor film storage cassette and places the semiconductor film onto a transparent resin in a seventeenth preferred embodiment of the present invention.
Figure 50A:
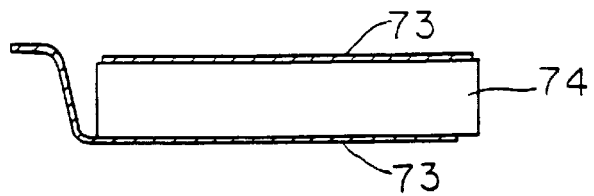
FIGS. 50A to 50E are views showing a modularizing process of a conventional solar battery.
Figure 50B:
Figure 50C:
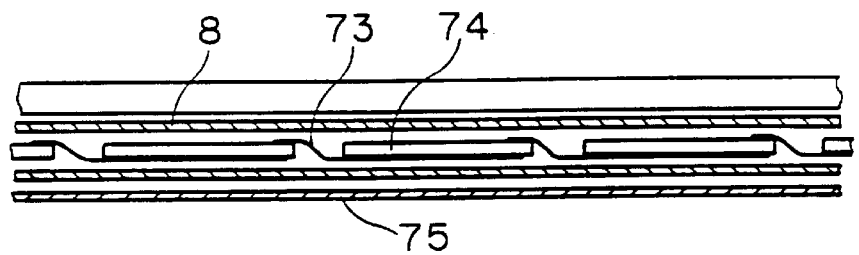
Figure 50D:
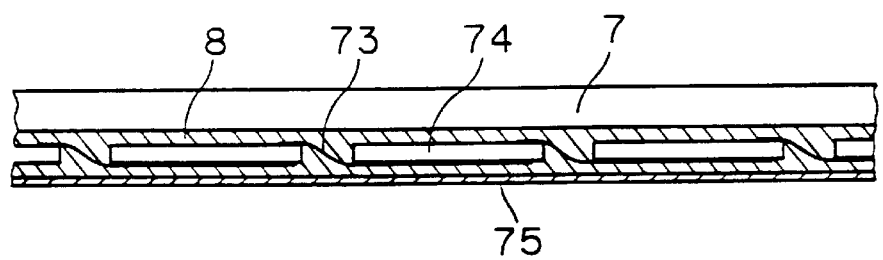
Figure 50E:
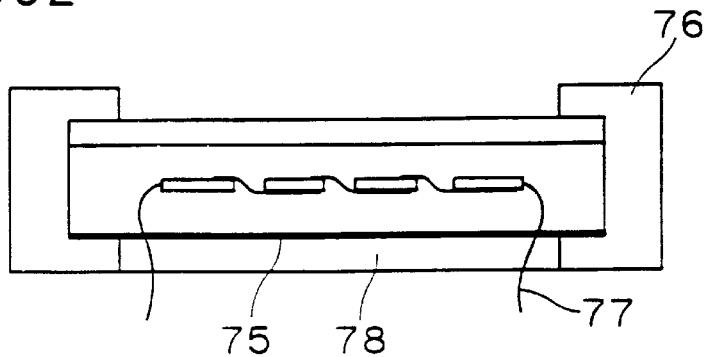
Figure 51A:
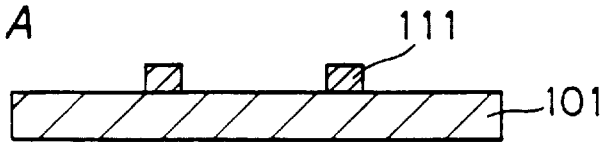
FIGS. 51A to 51E are views showing a manufacturing method of the conventional solar battery.
Figure 51B:
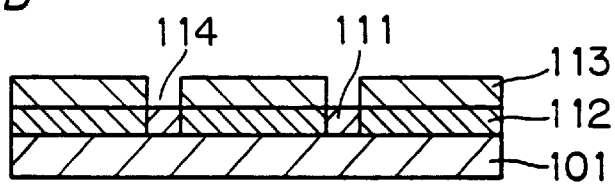
Figure 51C:
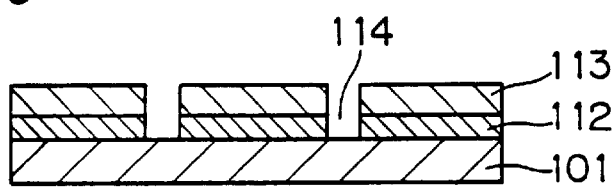
Figure 51D:
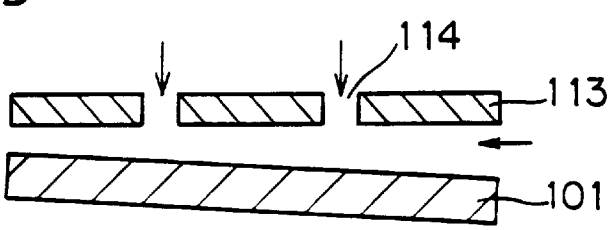
Figure 51E:
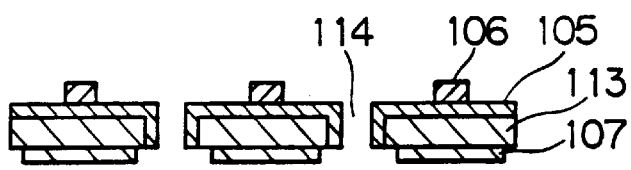
Figure 52:
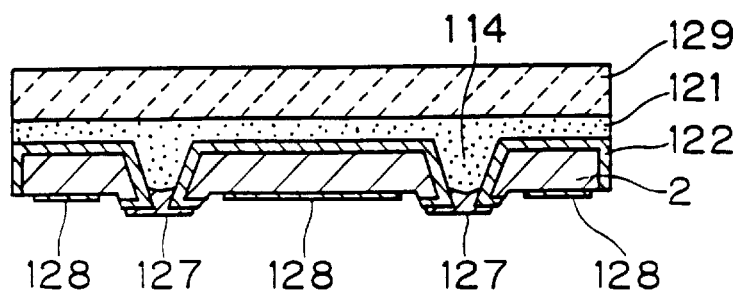
FIG. 52 is a cross sectional view of the conventional solar battery.

Now, a seventeenth preferred embodiment of the present invention will be described with reference to associated drawings. FIG. 49 shows an example of a process of arranging the semiconductor films 2 on the glass substrate 7 which is coated with the transparent resin 3 which was already described in relation to the fifth preferred embodiment. In the illustrated example, the semiconductor films 2 such as silicon semiconductor film are arranged by the robot arm 58 of an automatic transport robot 59 which includes suction chip 51.

The arm 58 of the automatic transport robot 59 shown in FIG. 49 only needs to be able to move in a vertical direction and back and forth, and if necessary to rotate, with an accuracy within 1 mm. A regular robot can transport with an accuracy of ±0.1 mm. In FIG. 49, the semiconductor film 2 is sucked by the suction chip 51 which moves in the directions indicated by arrows which point the right, retrieved from the cassette as it is sucked and held by the suction chip 51 and finally placed onto the transparent resin 3 without any damage at an accuracy of ±0.1 mm.

The semiconductor films 2 are silicon films in every one of the preferred embodiments above. This is because when the semiconductor films 2 are silicon films, a well established silicon technology can be used for any process and silicon films are cheap. However, the present invention does not prohibit use of other semiconductors such as GaAs, CdTe and CuInCe$_2$ compound semiconductors.

The foregoing description regarding each embodiment is centered on manufacturing of a solar battery of the type where the semiconductor films 2 have through holes and most electrodes are seated on one side. However, the present invention is applicable to other types of conventional solar batteries in which electrodes are formed on the both surfaces. In this case of course, a material cost is reduced and the manufacturing processes are simplified.

While the invention has been described in detail, the foregoing description is in all aspects illustrative and not restrictive. It is understood that numerous other modifications and variations can be devised without departing from the scope of the invention.

What is claimed is:

1. A method of forming a thin solar battery in which semiconductor films formed on a silicon substrate are separated from said silicon substrate, an electrode is formed on said semiconductor films so that said semiconductor films will serve as a power generation layer, and a glass substrate is stacked on light incident surfaces of said semiconductor films, said method comprising the steps of:

(a) forming semiconductor films on said silicon substrate and separating said semiconductor films from said silicon substrate;

(b) coating said glass substrate with a transparent resin;

(c) arranging said semiconductor films on said glass substrate which is coated with said transparent resin; and (d) forming electrodes by printing on said semiconductor films which are arranged on said glass substrate using a predetermined printing method.

2. The method of claim 1, wherein said step (a) of coating said glass substrate with said transparent resin comprises a step (a-1) of said transparent resin shaped like a sheet is disposed on said glass substrate and said glass substrate seating said transparent resin is passed between rollers so that said transparent resin is spread under pressure into a desired thickness and tightly adhered to said glass substrate.

3. The method of claim 2, wherein in said step (a-1), a vinyl sheet is disposed on said transparent resin, said transparent resin is sandwiched between said vinyl sheet and said glass substrate and passed between rollers, and said vinyl sheet is peeled off at a constant peeling angle θ after passing between said rollers, wherein said peeling angle θ satisfies a relation 0<θ<10°.

4. The method of claim 1, wherein in said step (a) of coating said glass substrate with said transparent resin, said transparent resin is disposed on said glass substrate and a blade is swept over a surface of said transparent resin so that said transparent resin of a desired thickness is tightly adhered to said glass substrate.

5. The method of claim 4, wherein said transparent resin contains transparent corpuscles.

6. The method of claim 5, said transparent corpuscles are shaped like pearls and each have a diameter which is approximately the same as the thickness of said transparent resin after coating.

7. The method of claim 1, wherein in said step (b) of arranging said semiconductor films on said glass substrate which is coated with said transparent resin, a grid frame is placed to face a front surface of said transparent resin and a plurality of said semiconductor films are disposed on said glass substrate which is coated with said transparent resin utilizing a grid pattern of said grid frame.

8. The method of claim 1, wherein in said step (c) forming electrodes by printing on said semiconductor films which are arranged on said glass substrate using said predetermined printing method, said predetermined printing method is a screen printing method or a pad printing method.

9. The method of claim 8, wherein said step (c) forming electrodes by printing on said semiconductor films which are arranged on said glass substrate using said predetermined printing method comprises a step (c-1) of drying said electrodes which are printed, printing and drying of said electrodes are repeated to form said electrodes on a plurality of said semiconductor films which are arranged on said glass substrate while performing a process of forming one electrode on one semiconductor film of said plurality of said semiconductor films is other than a process of forming another electrode on another semiconductor film thereof which is adjacent to said one semiconductor film.

10. The method of claim 9, wherein in said step (c-1) of drying said electrodes which are printed, said semiconductor films are heated through said glass substrate by a heater which is attached to a printer.

11. The method of claim 8, wherein in said step (c) forming electrodes by printing on said semiconductor films which are arranged on said glass substrate using said predetermined printing method, through holes are formed in said semiconductor films for separation from said substrate or formation of said electrodes, and an electrode printing mask and said semiconductor films are aligned to each other using said through holes and an alignment marker which is formed at a desired position in said electrode printing mask.

12. The method of claim 1 further comprising the steps of:
(d) printing a solder on a tab electrode formation area for connecting a plurality of said electrodes which are formed on said semiconductor films; and
(e) disposing a monolithic tab electrode member, which has pattern which corresponds to said area with said solder printed, on said area with said solder printed to thereby form tab electrodes.

13. The method of claim 1, wherein said semiconductor films which are separated from a specific substrate are sucked with pressure which does not exceed the destruction strength of said semiconductor films to handle said semiconductor films.

14. The method of claim 1, wherein said semiconductor films are made of silicon.

* * * * *